(12) United States Patent
Kondo et al.

(10) Patent No.: US 6,501,778 B1
(45) Date of Patent: Dec. 31, 2002

(54) PLANE EMISSION TYPE SEMICONDUCTOR LASER AND METHOD OF MANUFACTURING THE SAME

(75) Inventors: Takayuki Kondo, Suwa (JP); Takeo Kaneko, Misato-mura (JP); Katsumi Mori, Sakata (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/284,130
(22) PCT Filed: Jan. 22, 1998
(86) PCT No.: PCT/JP98/00283
§ 371 (c)(1),
(2), (4) Date: Jul. 1, 1999
(87) PCT Pub. No.: WO99/08351
PCT Pub. Date: Feb. 18, 1999

(30) Foreign Application Priority Data

Aug. 11, 1997 (JP) ............................. 9-216622

(51) Int. Cl.⁷ .................... H01S 5/22; H01S 5/183
(52) U.S. Cl. ............................ 372/46; 372/96
(58) Field of Search .................... 372/46, 96, 50

(56) References Cited

U.S. PATENT DOCUMENTS 4,792,959 A * 12/1988 Mueller et al. ............... 372/46
5,062,115 A    10/1991 Thorntou .................... 372/50

FOREIGN PATENT DOCUMENTS

| EP | 61231786 | 4/1985 |
| JP | 1-152683 | 6/1989 |
| JP | 2-78280 | 3/1990 |
| JP | 7-500950 | 1/1995 |
| JP | 8-97505 | 4/1996 |
| JP | 61-231786 | 10/1996 |
| JP | 9-223841 | 8/1997 |
| WO | WO 96/37933 | 11/1996 |
| WO | WO 97/22991 | 6/1997 |

OTHER PUBLICATIONS

D.L. Huffaker and D. G. Deppe, "Multiwavelength, Densely–Packed 2 = 2 Vertical–Cavity Surface–Emitting Laser Array Fabricated Using Selective Oxidation", IEEE Photonics Technology Letters vol. 8, No. 7, Jul. 1996.

* cited by examiner

Primary Examiner—James Davie
(74) Attorney, Agent, or Firm—Harness, Dickey & Pierce, P.L.C.

(57) ABSTRACT

The present invention aims at providing a light source for a semiconductor laser beam scanner having high resolution in scanning and a high degree of mounting freedom, and suitable for emitting a laser beam from the surface. Therefore, a surface emission type semiconductor laser includes at least a first mirror 102, an active layer 103, a current narrowing layer 113, a contact layer 106, and a second mirror 111, which are formed on a semiconductor substrate 101; wherein the current narrowing layer 113 is made of a stripe AlAs layer 105, and an Al oxide layer 108 formed to surround the AlAs layer 105; the region of the contact layer 106, which overlaps the Al oxide layer, is formed in a comb shape 109, and independent contact electrodes 110 are respectively formed on the upper surfaces of the teeth of the comb shape 109 of the contact layer.

6 Claims, 33 Drawing Sheets

PLANE EMISSION TYPE SEMICONDUCTOR LASER AND METHOD OF MANUFACTURING THE SAME

TECHNICAL FIELD

The present invention relates to a surface emission type semiconductor laser which emits a laser beam perpendicularly to a semiconductor substrate. Particularly, the present invention relates to a surface emission type semiconductor laser capable of electrically scanning light output in one dimension.

BACKGROUND ART

A laser beam scanner for scanning a laser beam generally uses a hologram or galvanomirror, but such a device requires a mechanical movement, and is thus accompanied with vibrations and noise. The device also has drawbacks in that it has high power consumption, difficulties in miniaturization because it comprises an assembly of many parts, and low resistance to an impact.

On the other hand, for example, Japanese Unexamined Patent Publication No. 1-152683 discloses that a semiconductor laser array device comprising a plurality of semiconductor lasers arranged in a line, and a lens system disposed in front of the semiconductor laser array device so that its aperture receives the laser beams emitted from all semiconductor lasers is provided for realizing scanning of a laser beam by changing the position of the emission point on the semiconductor laser array and operating a lens of the lens system. This method requires no mechanical movable mechanism, and thus the above-mentioned drawbacks can be solved.

However, an end surface emission type stripe laser array has a limit to the distance of emission points, and thus cannot be said to be practical from the viewpoints of difficulties in manufacturing and resolution.

Therefore, the use of a surface emission laser array as the semiconductor laser array device permits realization of a laser scanner with high resolution. For example, Japanese Unexamined Patent Publication No. 8-97505 discloses that a resonator is formed by using a layered structure perpendicular to a substrate, and a plurality of contact electrodes are provided on one resonator and separated by forming high-resistance regions so that the electrodes are independently driven to change the position of the emission point.

However, the above-described surface emission type semiconductor laser is suitable for emitting a laser beam from the rear side of the substrate, but has the problems described below with respect to emission of a laser beam from the surface side of the substrate.

The electric currents injected from the contact electrodes are mostly converted into light directly below the contact electrodes. Since the contact electrodes do not transmit a laser beam, the light produced directly below the electrodes cannot be emitted from the back, and is thus finally converted into heat. Namely, all currents injected directly below the contact electrodes become reactive currents. This results in an increase in the threshold value, and a reduction in efficiency. In a conventional structure, the reactive current can be decreased only by decreasing the area of the contact electrodes. However, a decrease in the electrode area causes an increase in contact resistance, thereby decreasing output due to heat generation, and deteriorating crystals and reliability.

As described above, the conventional semiconductor laser beam scanner causes large reactive current if a laser beam is emitted from the back side of the substrate, causing the problem of deteriorating characteristics such as the threshold value, efficiency, output, reliability, etc.

On the other hand, if the laser beam is emitted only from the back of the substrate, a practical problem occurs. Such a device should be used in a state wherein it is mounted on a pedestal, and requires a large number of wiring between the device and a driving circuit. Therefore, the device is turned upside down and subjected to flip chip mounting using solder bumps. However, in the case of flip chip mounting, the pitch of the bonding pads must be as large as at least 180 μm because of the use of the solder bumps. This causes an increase in the dimensions of the device, and the problem of directly affecting the number of devices which can be obtained from one substrate, i.e., the cost. This becomes critical with an increase in the number of electrodes for increasing the laser beam scanning width and resolution.

The present invention has been achieved for solving the above-described problems, and an object of the invention is to provide a light source for a semiconductor laser beam scanner which exhibits a high degree of mounting freedom and high resolution in scanning, and is suitable for emitting a laser beam from the surface side.

SUMMARY OF THE INVENTION (1) The present invention provides a surface emission type semiconductor laser comprising a first reflecting mirror, an active layer, a current narrowing layer, a contact layer, a second reflecting mirror, and contact electrodes, which are formed on a semiconductor substrate, so that a laser beam is emitted perpendicularly to the semiconductor substrate;

wherein the current narrowing layer comprises an AlAs layer and an Al oxide layer formed to surround the AlAs layer;

the AlAs layer is formed in a stripe to form a stripe emission region;

the contact layer is formed in a stripe wider than the stripe emission region to completely cover the stripe emission region; and a plurality of the contact electrodes are formed independently so as not to overlap the stripe emission region.

The principle of the operation of the surface emission type semiconductor laser of the present invention will be described. When a current is passed through one of the divided contact electrodes, the current is led to be concentrated in the emission region by the current narrowing layer. This is described in further detail below. The current narrowing layer comprises the stripe AlAs layer and the Al oxide layer formed to surround the AlAs layer so that the injected current flows horizontally through the contact layer because the Al oxide layer formed below the contact electrodes is made of an insulator, and is led to the emission region through the stripe AlAs layer made of a conductor. The thus-led current is converted into light by the active layer of the emission region, amplified by a Fabry Perot resonator comprising the first and second mirrors to produce oscillation, and emitted as a laser beam perpendicular to the substrate. When the first mirror has higher reflectance than the second mirror, the laser beam is mainly emitted in the surface direction of the substrate. At this time, the laser emission point is formed on the stripe emission region near the contact electrode through which a current is passed. A current is successively passed through the adjacent independent contact electrodes to move the laser emission point on the stripe emission region.

Particularly, the surface emission type semiconductor laser of the present invention comprises the current narrowing layer and thus does not consume a current directly below the contact electrodes. Namely, it is possible to remove the reactive current. It is also possible to increase the area of contact between the contact layer and the contact electrodes, thereby decreasing contact resistance and generation of heat. Therefore, since the contact electrodes do not intercept a laser beam because the electrodes do not overlap the emission region, the structure of the semiconductor laser is very suitable for emitting a laser beam from the surface side.

Since the laser emission surface and the contact electrodes are in the same plane, material for the pedestal is not limited, and thus the degree of mounting freedom is high.

(2) The region of the contact layer, which is formed on the Al oxide layer, is preferably formed in a comb shape, and the plurality of the independent contact electrodes are preferably formed to respectively contact the comb teeth of the contact layer.

As a result, it is possible to suppress current spreading in the stripe emission region in the direction of the stripe length to increase the current density, thereby further decreasing the threshold value and improving efficiency.

The region of the contact layer, which overlaps the Al oxide layer, contacts the contact electrodes and plays a role as a horizontal passage of a current. The horizontal current component includes a component flowing to the emission region, i.e., a component perpendicular to the stripe, and a component parallel to the stripe. Since the horizontal current component parallel to the stripe excessively decreases the current density in the emission region, it is preferable to remove this component.

Therefore, the region of the contact layer, which overlaps the Al oxide layer, is formed in a comb shape so that one contact electrode contacts only one comb tooth, thereby removing the horizontal current component parallel to the stripe. As a result, it is possible to suppress current spreading in the direction of the stripe length to increase the current density, thereby further decreasing the threshold value and improving efficiency.

(3) The contact layer is preferably a second conduction type in the stripe emission region, and thus a first conduction type region and second conduction type region are alternately formed in the region on the Al oxide layer in the direction of the stripe length so that the plurality of the independent contact electrodes respectively contact the second conduction type regions of the contact layer.

As a result, it is possible to suppress current spreading in the stripe emission region in the direction of the stripe length to increase the current density, thereby further decreasing the threshold value and improving efficiency.

The region of the contact layer, which is formed on the Al oxide layer, contacts the contact electrodes and plays a role as a horizontal passage of a current. The horizontal current component includes a component flowing to the emission region, i.e., a component perpendicular to the stripe, and a component parallel to the stripe. Since the horizontal current component parallel to the stripe excessively decreases the current density in the emission region, it is preferable to remove this component.

Therefore, in the region of the contact layer, which is formed above the Al oxide layer, the first and second conduction type regions are alternately formed in the direction of the stripe length so that one of the contact electrodes contacts only one second conduction type region, thereby removing the horizontal current component parallel to the stripe. As a result, it is possible to suppress current spreading in the stripe emission region in the direction of the stripe length to increase the current density, thereby further decreasing the threshold value and improving efficiency.

(4) The present invention comprises:

the step of forming a first reflecting mirror on a semiconductor substrate;

the step of forming multilayered semiconductor layers comprising at least an active layer, an AlAs layer and a contact layer on the first reflecting mirror;

the step of etching the multilayered semiconductor layers until the AlAs layer is exposed, leaving the contact layer in a stripe;

the step of oxidizing the entire exposed AlAs layer and the AlAs layer below the stripe contact layer by heat treatment at a temperature of 280 to 500° C. in a nitrogen atmosphere containing water vapor to convert the AlAs layer to an Al oxide layer, leaving the AlAs layer having a predetermined width, to form a stripe AlAs layer surrounded by the Al oxide layer and having a width smaller than the width of the stripe contact layer;

the step of forming a plurality of independent contact electrodes so that the electrodes contact the upper side of the contact layer and do not overlap the stripe emission region; and the step of forming a second reflecting mirror on the contact layer so as to completely cover at least the stripe emission region.

(5) In the step of etching the multilayered semiconductor layers until the AlAs layer is exposed, a dry etching method using only an inert gas is preferably used.

(6) The present invention comprises:

the step of forming a first reflecting mirror on a semiconductor substrate;

the step of forming multilayered semiconductor layers comprising at least an active layer, an AlAs layer and a contact layer on the first reflecting mirror;

the step of etching the multilayered semiconductor layers until the AlAs layer is exposed, leaving the contact layer in a stripe;

the step of oxidizing the entire exposed AlAs layer and the AlAs layer below the stripe contact layer by heat treatment at a temperature of 280 to 500° C. in a nitrogen atmosphere containing water vapor to convert the AlAs layer to an Al oxide layer, leaving the AlAs layer having a predetermined width, to form a stripe AlAs layer surrounded by the Al oxide layer and having a width smaller than the width of the stripe contact layer;

the step of etching the contact layer on the Al oxide layer to form a comb-shaped contact layer;

the step of forming a plurality of independent contact electrodes so that the electrodes do not overlap the stripe emission region, and respectively contact the surfaces of the comb teeth of the contact layer and correspond to the comb teeth of the contact layer; and the step of forming a second reflecting mirror on the contact layer so as to completely cover at least the stripe AlAs layer.

(7) In the step of etching the multilayered semiconductor layers until the AlAs layer is exposed, a dry etching method using only an inert gas is preferably used.

(8) The present invention comprises:
the step of forming a first reflecting mirror on a semiconductor substrate;
the step of forming multilayered semiconductor layers comprising at least an active layer, an AlAs layer and a contact layer on the first reflecting mirror;
the step of etching the multilayered semiconductor layers until the AlAs layer is exposed, leaving the contact layer in a stripe having at least one comb-shaped side;
the step of oxidizing the entire exposed AlAs layer and the AlAs layer below the stripe contact layer by heat treatment at a temperature of 280 to 500° C. in a nitrogen atmosphere containing water vapor to convert the AlAs layer to an Al oxide layer, leaving the AlAs layer having a predetermined width, to form a stripe AlAs layer surrounded by the Al oxide layer and having a width smaller than the width of the stripe contact layer;
the step of forming a plurality of independent contact electrodes so that the electrodes do not overlap the stripe emission region, and respectively contact the surfaces of the comb teeth of the contact layer and correspond to the comb teeth of the contact layer; and
the step of forming a second reflecting mirror on the contact layer so as to completely cover at least the stripe AlAs layer.

(9) In the step of etching the multilayered semiconductor layers until the AlAs layer is exposed, a dry etching method using only an inert gas is preferably used.

(10) The present invention comprises:
the step of forming a first reflecting mirror comprising a first conduction type semiconductor layer on a semiconductor substrate;
the step of forming multilayered semiconductor layers comprising at least an active layer, a second conduction type AlAs layer and a first conduction type contact layer on the first reflecting mirror;
the step of etching the multilayered semiconductor layers until the AlAs layer is exposed, leaving the contact layer in a stripe;
the step of oxidizing the entire exposed AlAs layer and the AlAs layer below the stripe contact layer by heat treatment at a temperature of 280 to 500° C. in a nitrogen atmosphere containing water vapor to convert the AlAs layer to an Al oxide layer, leaving the AlAs layer having a predetermined width, to form a stripe AlAs layer surrounded by the Al oxide layer and having a width smaller than the width of the stripe contact layer;
the step of impurity diffusion for partially making the first conduction type contact layer the second conduction type;
the step of forming a plurality of independent contact electrodes so that the electrodes contact the surface of the second conduction type region of the contact layer, which is formed on the Al oxide layer, and do not overlap the stripe emission region; and
the step of forming a second reflecting mirror on the contact layer so as to completely cover at least the stripe emission region.

A dry etching process for a compound semiconductor generally uses a reactive gas such as $Cl_2$ or the like in order to increase the etching rate. However, in the present invention, particularly a gas having low reactivity, such as an inert gas or the like, is preferably used. The reason for this is the following. In the present invention, etching is finished when the AlAs layer is exposed in a wide range. However, since the AlAs layer has high reactivity, the use of a reactive gas causes excessive reaction of the exposed AlAs layer and the gas remaining on or adhering to the substrate surface in a chamber after the completion of etching, thereby causing surface deterioration.

BEST MODE FOR CARRYING OUT THE INVENTION

A surface emission type semiconductor laser and the manufacturing method therefor of the present invention will be described in detail below on the basis of the preferred embodiments shown in the attached drawings.

First Embodiment

The first embodiment of the present invention is described with reference to the drawings.

Laser Structure

Figure 1:
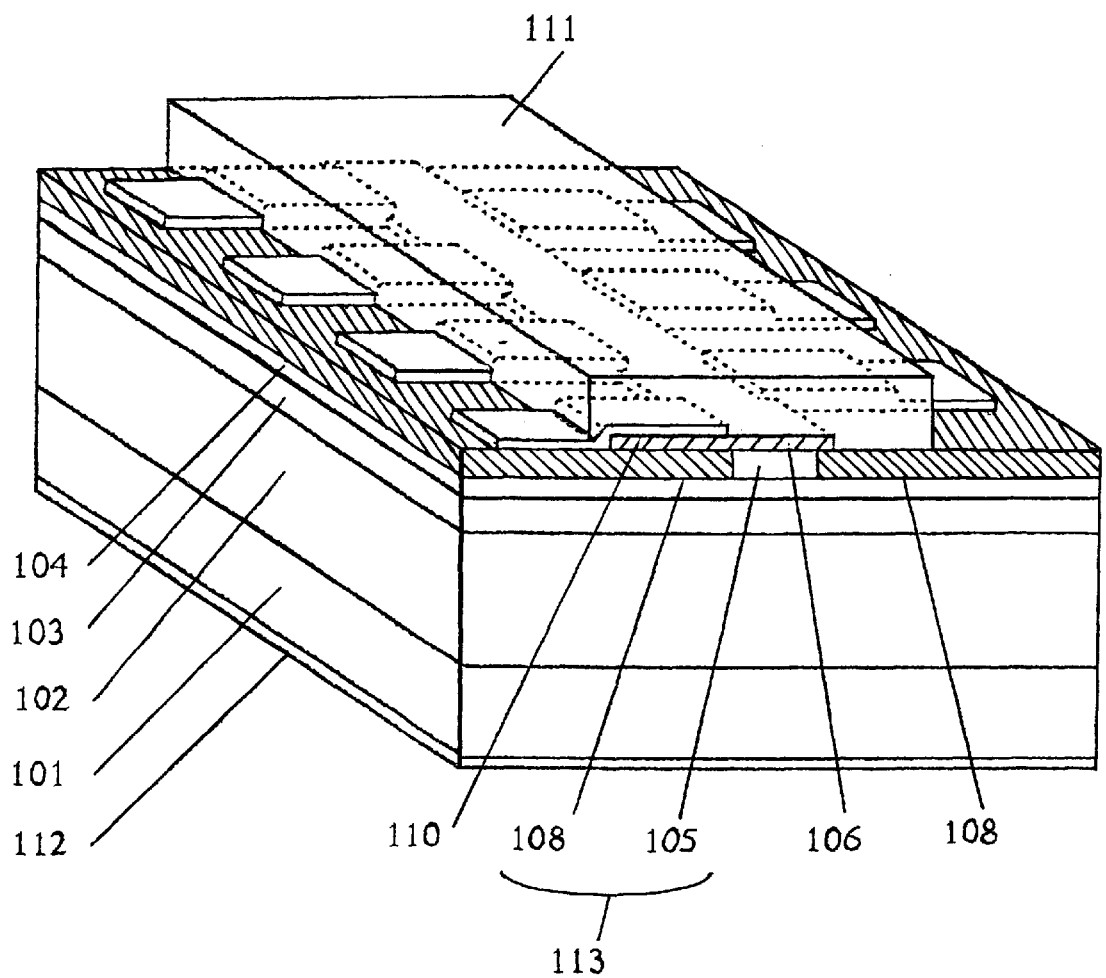
FIG. 1 is a schematic perspective view of a semiconductor laser in accordance with a first embodiment of the present invention.
Figure 2:
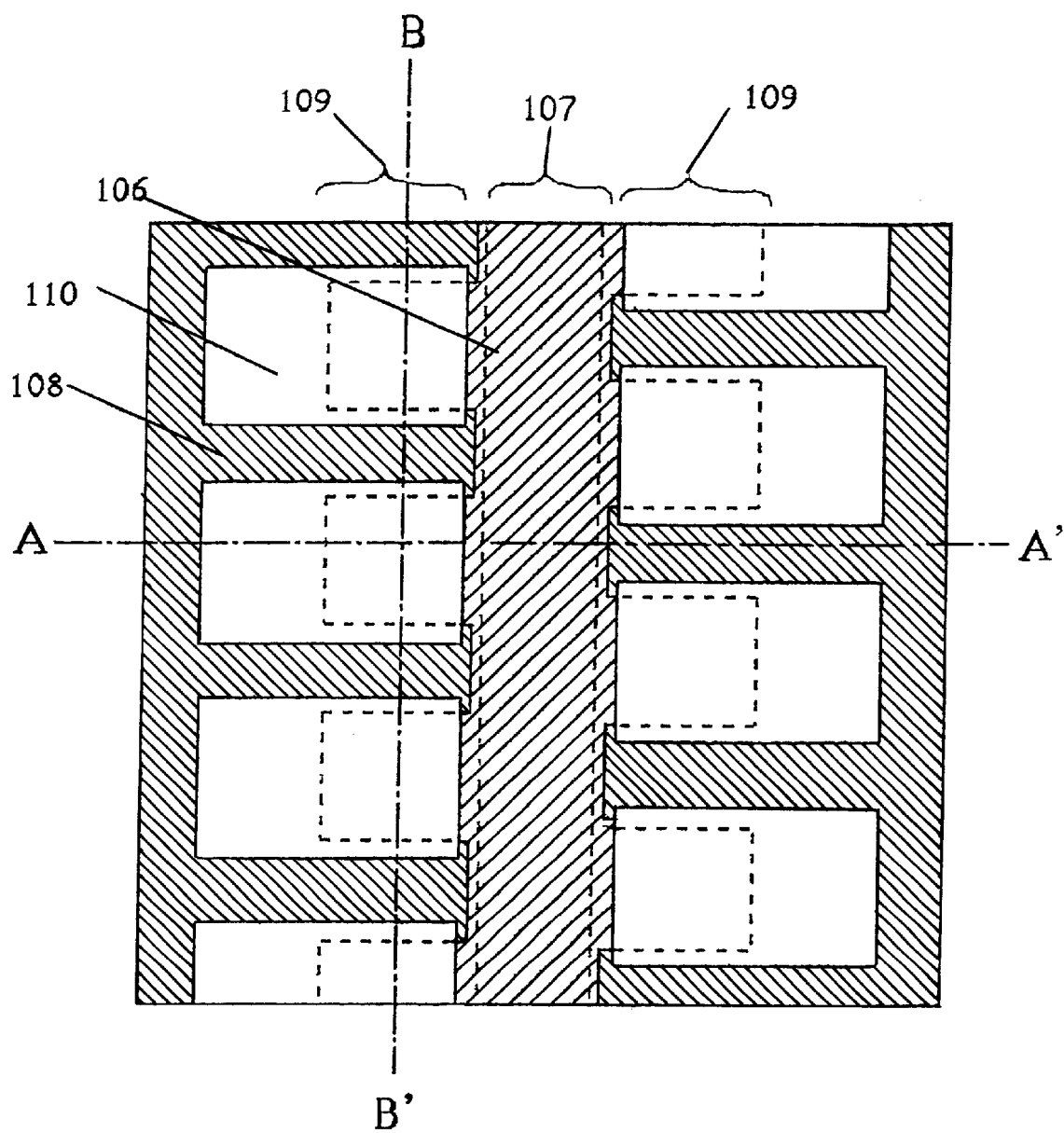
FIG. 2 is a top view of the device of FIG. 1.
Figure 3:
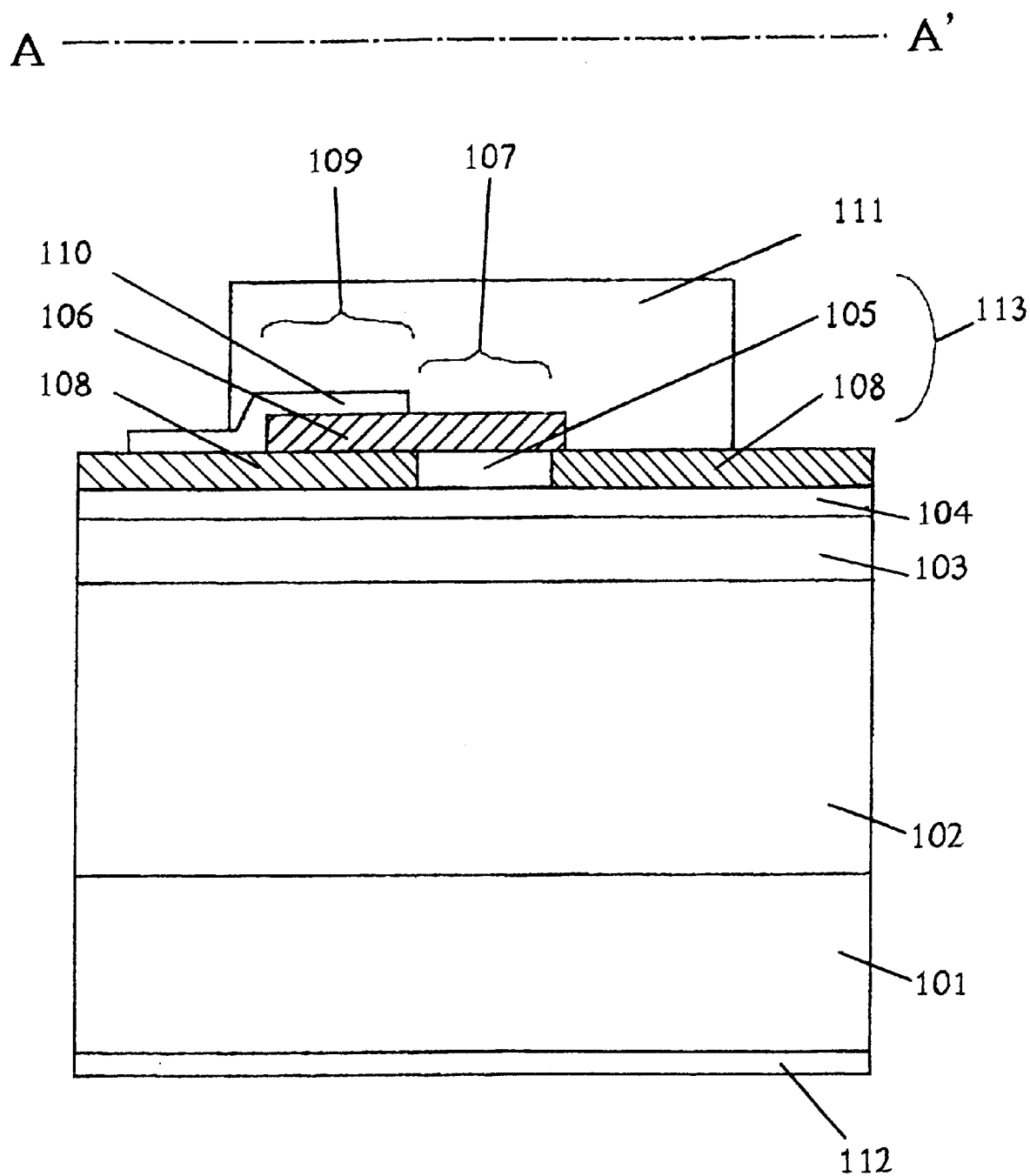
FIG. 3 is a sectional view of the device of FIG. 1.
Figure 4:
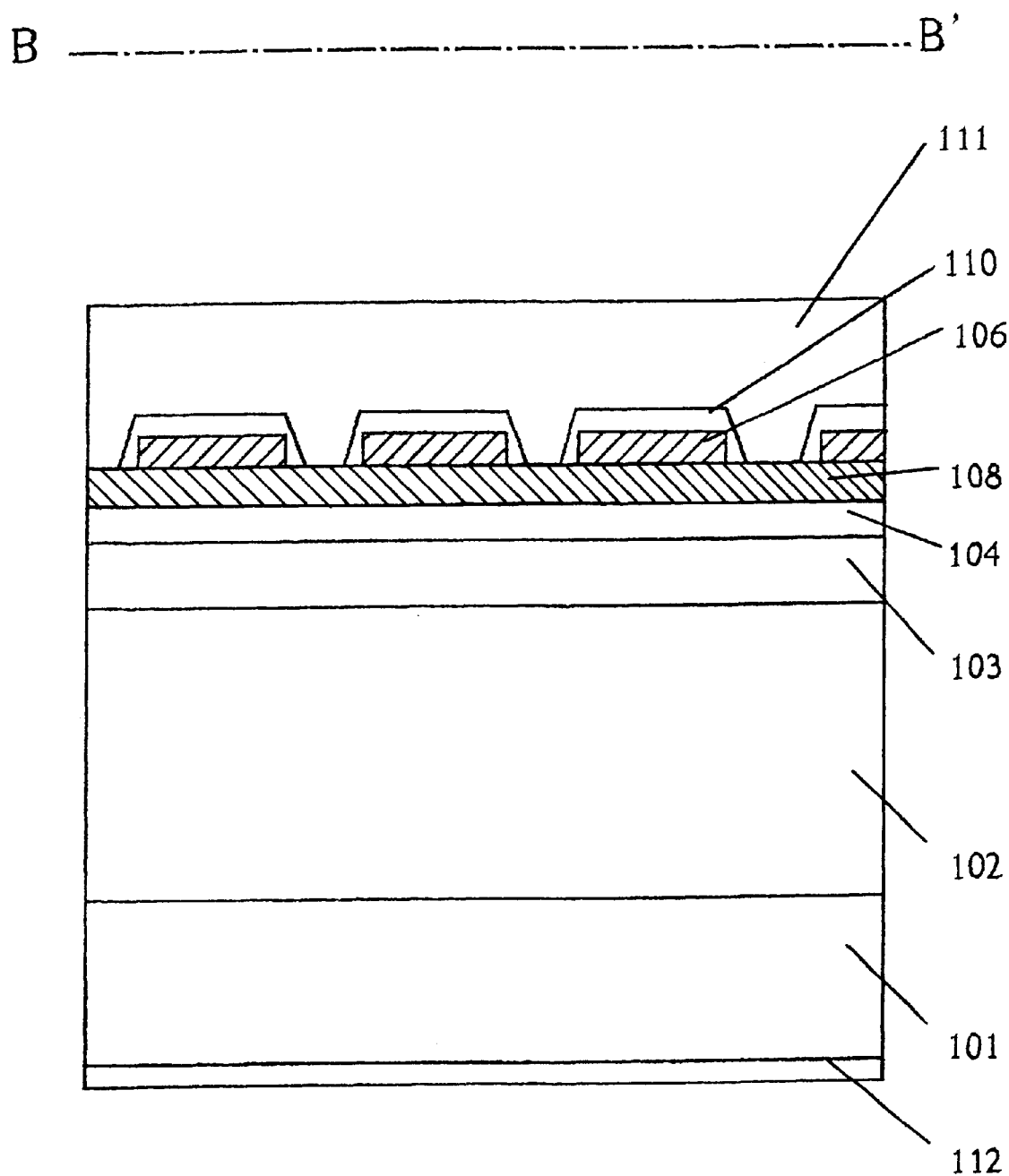
FIG. 4 is a sectional view of the device of FIG. 1.

FIGS. 1 to 4 are schematic drawings of a plane emission type semiconductor laser of the first embodiment of the present invention. FIG. 1 is a perspective view schematically showing a section of the same laser, FIG. 2 is a top view, and FIGS. 3 and 4 are sectional views taken along lines AA' and BB', respectively. In FIG. 2, a second mirror 111 is omitted in order to clearly show the arrangement of a contact layer 106, an emission region 107, and contact electrodes 110, which will be described below.

The plane emission type semiconductor laser comprises distributed reflection type semiconductor multilayered reflection layers (referred to as a "first mirror" hereinafter) 102 formed by alternately laminating 30 pairs of a n-type $Al_{0.15}Ga_{0.85}As$ and a n-type AlAs layer on a n-type GaAs substrate 101 to have a reflectance of 99% or more at a wavelength of 800 nm, an active layer 103 formed by alternately laminating 5 layers each of a quantum well layer made of n-type GaAs and a barrier layer made of n-type $Al_{0.3}Ga_{0.7}As$, a clad layer 104 made of p-type $Al_{0.7}Ga_{0.3}As$, a current narrowing layer 113 comprising a p-type AlAs layer 105 and an Al oxide layer 108, a contact layer made of p-type $Al_{0.15}Ga_{0.85}As$, and a dielectric multilayered reflection film (referred to as a "second mirror" hereinafter) 111 formed by alternately laminating 7 pairs of $SiO_2$ and $Ta_2O_5$ to have a reflectance of 98.5 to 99% for light near a wavelength of 800 nm, all of which are laminated in turn on the substrate 101 (refer to FIG. 1).

The current narrowing layer 113 comprises the stripe p-type AlAs layer 105, and the Al oxide layer 108 formed to surround the AlAs layer 105. The AlAs layer 105 has conductivity, while the Al oxide layer 108 is an insulator and thus functions as a stripe current narrowing structure. Hereinafter, a stripe region where the AlAs layer 105 is present is referred to as an "emission region 107" (refer to FIGS. 2 and 3).

This embodiment is characterized in that the contact layer 106 is formed to cover the emission region 107 and have a comb-shaped portion 109 which contacts the Al oxide layer 108 (refer to FIG. 2).

For example, the contact electrodes 110 made of Cr and an Au-Zn alloy are formed to contact the surfaces of the comb teeth 109 of the contact layer 106. A plurality of the contact electrodes 110 are independently formed to respectively correspond to the comb teeth 109. The contact electrodes 110 are not formed on the emission region 107 (refer to FIGS. 2, 3 and 4).

The second mirror 111 is formed to completely cover at least the stripe emission region 107.

An electrode (referred to as a "lower electrode" hereinafter) 112 made of, for example, an Au-Ge alloy, Ni and Au is formed below the n-type GaAs substrate 101.

The present invention is not limited to this embodiment, and various modified embodiments can be made within the scope of the gist of the invention.

Although, in this embodiment, an AlGaAs system semiconductor material is used for the semiconductor substrate, the first mirror, the active layer, and the contact layer, the present invention is not limited to these materials. Of course, other materials such as AlGaInP system, InGaAsP system, InGaAs system, ZnSSe system, ZnMgSSe system semiconductor materials, and the like can also be used.

Although, in this embodiment, the AlAs layer 108 and the contact layer 106 are formed to contact each other, another semiconductor layer may be provided between the AlAs layer 108 and the contact layer 106. For example, a semiconductor multilayered reflection film may be provided.

Although the dielectric multilayered reflection film formed by using $SiO_2$ and $Ta_2O_5$ as materials is used as the second mirror, other dielectric materials such as $TiO_2$, ZnSe, MgF, $Al_2O_3$, and the like may be used.

Oscillating Operation of Laser

Figure 5:
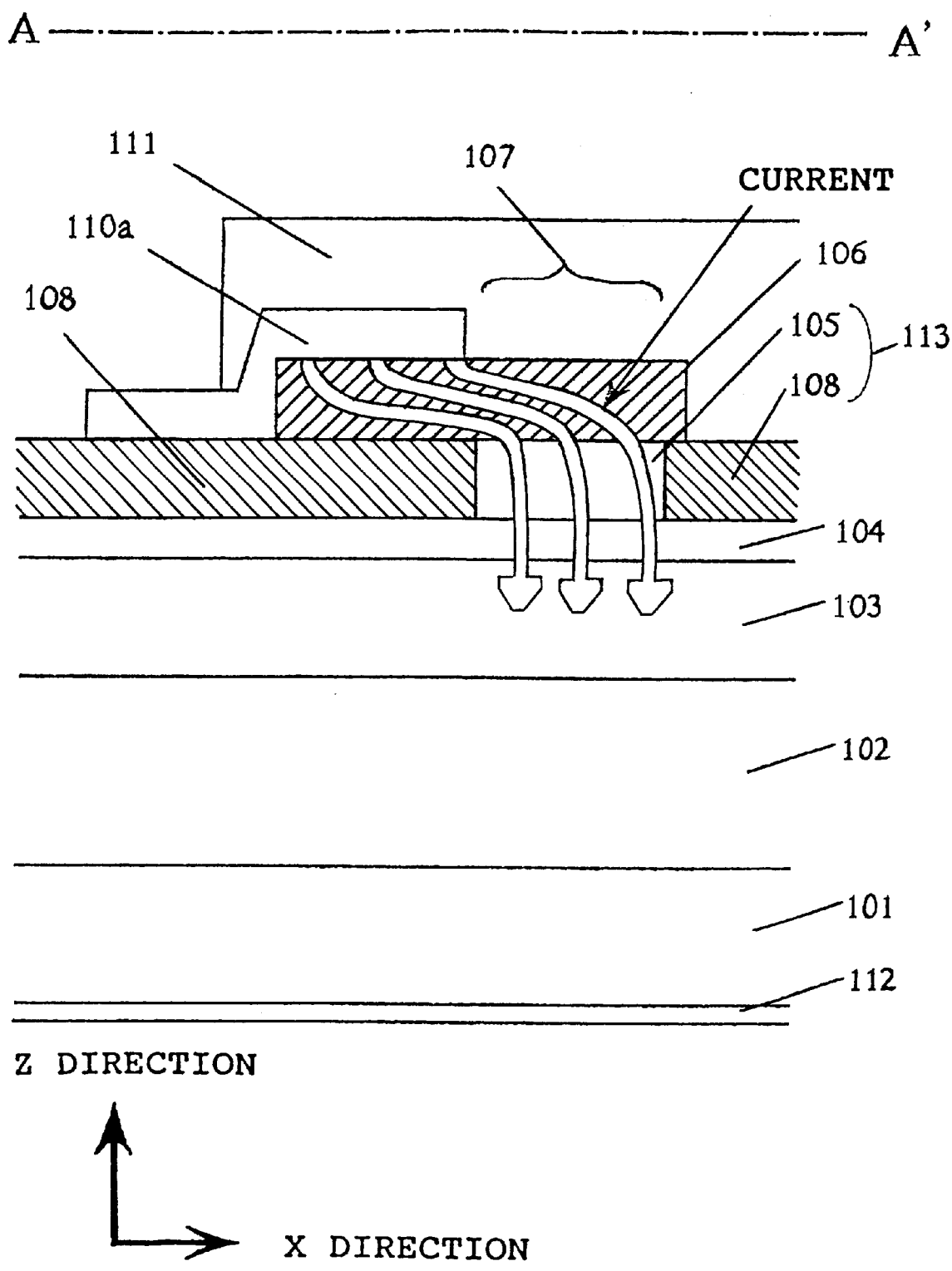
FIG. 5 is a sectional view schematically showing current flows in the device of FIG. 1.

In the surface emission type semiconductor laser of the present invention, a forward voltage is applied between the contact electrodes 110 and the lower electrode 112 to inject a current. When a current is passed through one contact electrode 110a, the current is led to be concentrated in the emission region by the current narrowing layer 113. This will be described in further detail with reference to FIG. 5. FIG. 5 is an enlarged sectional view of the vicinity of the emission region 107 taken along line AA', which schematically shows current flows in the contact layer. The current narrowing layer 113 comprises the stripe AlAs layer 105 and the Al oxide layer 108 formed to surround the AlAs layer 105. The AlAs layer 105 comprises a semiconductor, i.e., a conductor, while the Al oxide layer 108 comprises an insulator. The current injected from the contact electrode 110a flows horizontally (in the X direction in FIG. 5) through the contact layer 106 because the Al oxide layer 108 formed below the contact electrode 110a comprises an insulator, and passes through the portion of the stripe AlAs layer 105 to be led to the emission region 107. The thus-led current is converted into light in the active layer 103 below the emission region 107, amplified by a Fabry Perot resonator comprising the first mirror 102 and the second mirror 111 to produce laser oscillation, and then emitted as a laser beam perpendicular to the semiconductor substrate 101. When the first mirror 102 has reflectance higher than that of the second mirror 111, the laser beam is mainly emitted in the surface direction of the substrate. At this time, the laser emission point is formed on the stripe emission region near the contact electrode 110a through which a current is passed. A current is successively passed through the adjacent contact electrodes to move the laser emission point on the stripe emission region 107.

Particularly, in the surface emission type semiconductor laser of the present invention, no current is consumed directly below the contact electrodes 110 because the current narrowing layer 113 is provided. Namely, reactive currents can be removed. Therefore, the contact electrodes 110 do not overlap the emission region 107 so as not to intercept the laser beam, thereby forming a structure suitable for emitting a laser beam from the surface side. Namely, since the laser emission surface and the divided contact electrodes 110 are in the same surface, the mounting method is less limited, and high practicability can be obtained.

Figure 6:
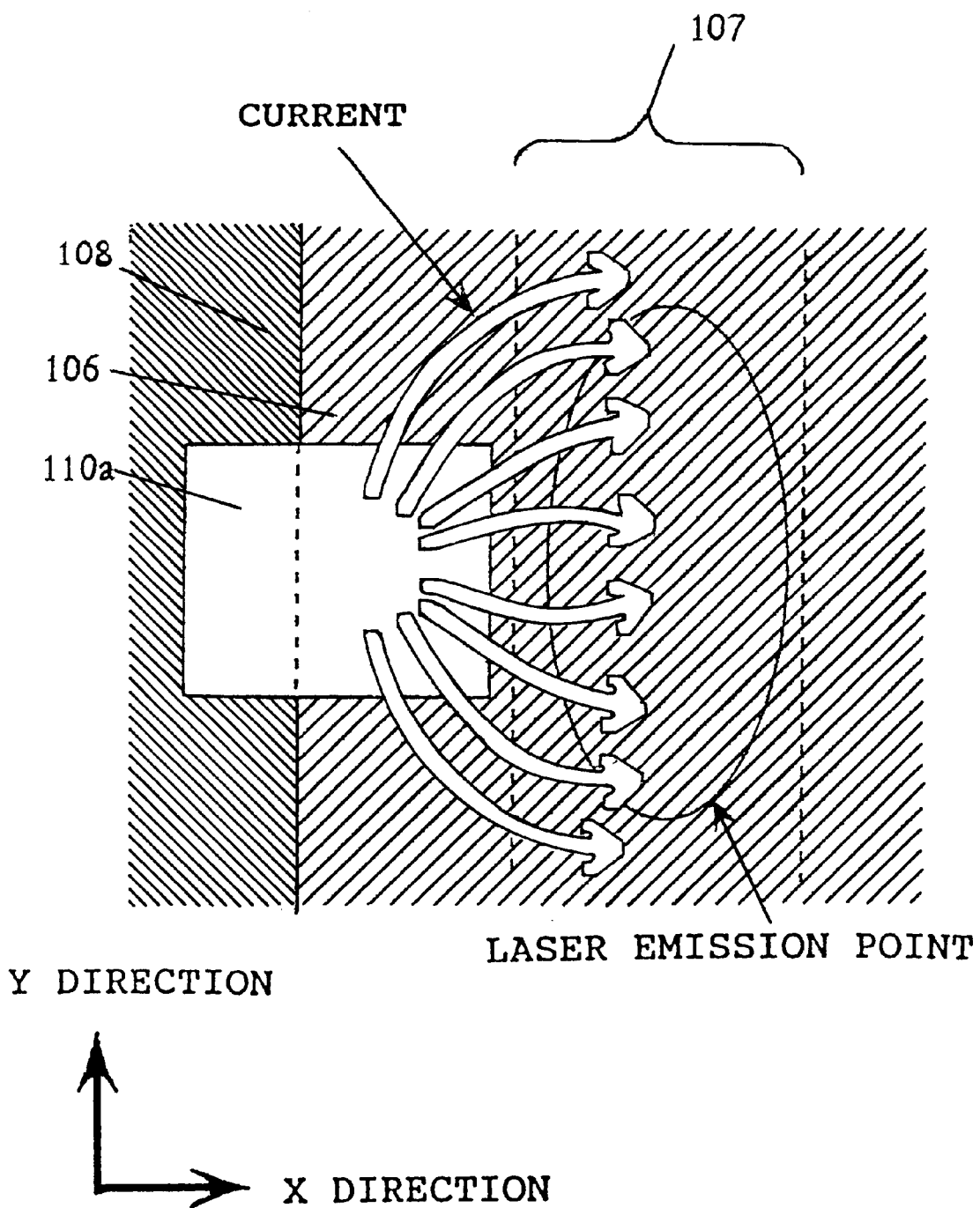
FIG. 6 is a top view schematically showings current flows when a contact layer is not formed in a comb shape.
Figure 7:
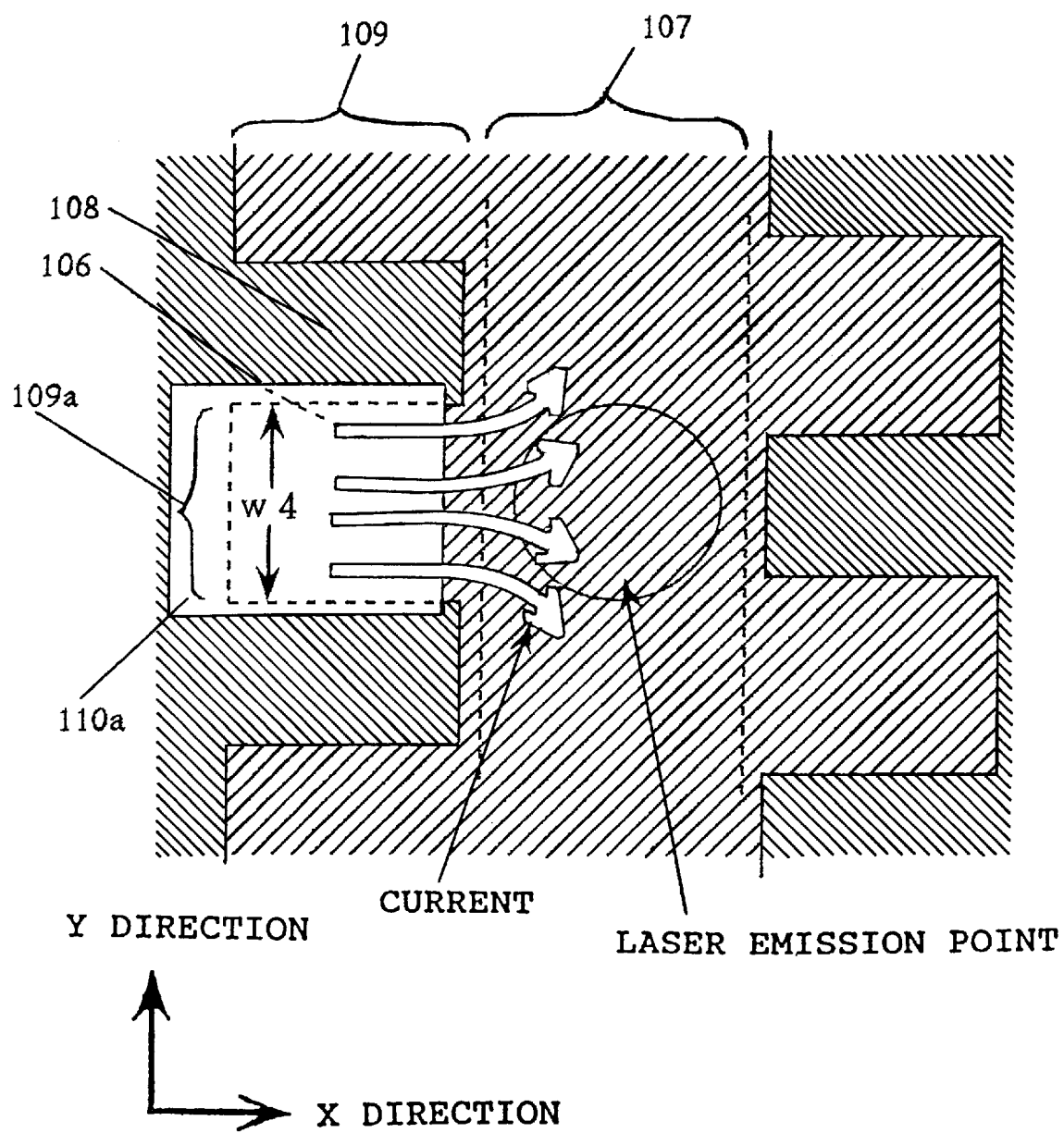
FIG. 7 is a top view schematically showing current flows in the semiconductor laser in accordance with the first embodiment of the present invention.
Figure 8:
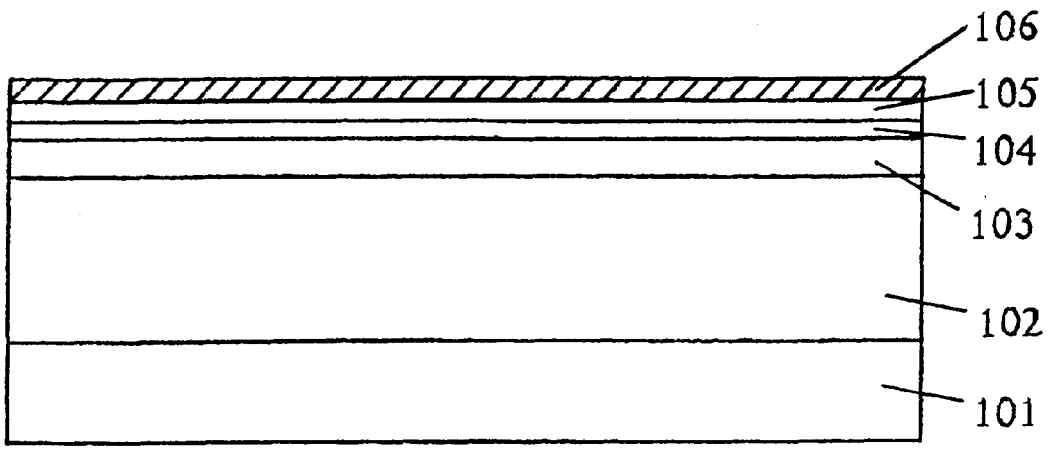
FIG. 8 is a sectional view showing the process for manufacturing the semiconductor laser in accordance with the first embodiment of the present invention.
Figure 9:
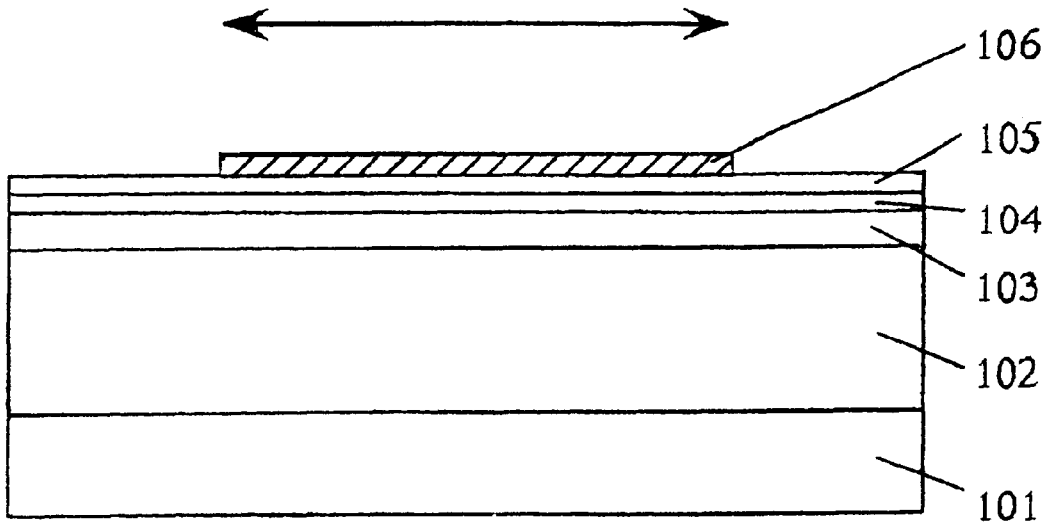
FIG. 9 is a sectional view showing the process for manufacturing the semiconductor laser in accordance with the first embodiment of the present invention.

In addition, the contact layer 106 has the comb-shaped portion 109 in contact with the Al oxide layer 108, and a plurality of the contact electrodes 110 are independently formed to respectively correspond to the teeth of the comb-shaped portion 109. As a result, it is possible to suppress current spreading in the stripe emission region 107 in the direction of the stripe length to increase the current density, and further decrease the threshold value and improve efficiency. This is described below with reference to FIGS. 6 and 7. FIGS. 6 and 7 are enlarged top views of the vicinities of the emission region in which the contact layer is not formed in a comb shape and the emission region in which the contact layer is formed in a comb shape, respectively. These figures schematically show current flows. However, in the figures, the contact electrodes and the second mirror are not shown in order to clearly indicate the current flows in the contact layer.

The current flows in the case where the contact layer is not formed in a comb shape will be described with reference to FIG. 6. The region of the contact layer 106 which overlaps the Al oxide layer 108 contacts the contact electrode and plays a role as a horizontal current passage. The horizontal current component includes a component flowing to the emission region, i.e., a component (in the X direction shown in FIG. 6) perpendicular to the stripe, and a component (in the Y direction shown in FIG. 6) parallel to the stripe. The horizontal current component parallel to the stripe diffuses the current in the emission region, and thus excessively decreases the current density. This causes an increase in the threshold value, and deterioration in efficiency.

Therefore, the region of the contact layer which overlaps the Al oxide layer is formed in a comb shape so that one contact electrode contacts only one comb tooth to remove the horizontal current component parallel to the stripe. As shown in FIG. 7, the current injected into the comb tooth 109a of the contact layer 106 from the contact electrode 110a is diffused within the width W4 of the comb tooth 109a in the Y direction shown in FIG. 7. As a result, it is possible to suppress current spreading in the direction of the stripe length to increase the current density, decrease the threshold value, and improve efficiency.

Manufacturing Method

The manufacturing method is described below with reference to FIGS. 8 to 15. First, 30 pairs of n-type $Al_{0.15}Ga_{0.85}As$ and n-type AlAs layers are alternately laminated on the n-type GaAs substrate 101 to form the first reflecting mirror 102 having a reflectance of 99% or more at 800 nm. Five layers each of the quantum well layer made of n-type GaAs, and the barrier layer made of n-type $Al_{0.3}Ga_{0.7}As$ are alternately laminated to form the active layer 103. Then, the second conductive type clad layer 104 made of p-type $Al_{0.7}Ga_{0.3}As$, the p-type AlAs layer 105, and the contact layer 106 made of p-type $Al_{0.15}Ga_{0.85}As$ are laminated in turn (refer to FIG. 8).

Each of these layers is epitaxially grown by an organometal vapor phase growth method. For example, this epitaxial growth is performed by using organometals TMGa (trimethylgallium) and TMAl (trimethylaluminum) as III-group raw materials, $AsH_3$ (arsine) as a V-group raw material, $H_2Se$ (hydrogen selenide) as a n-type dopant, and DEZn (diethylzinc) as a p-type dopant at a growth temperature of 750° C. and a growth pressure of 150 Torr.

After the layers are successively laminated, a stripe resist mask is formed on the contact layer 106 by photolithography. The stripe width W1 is 25 μm. Then, dry etching is carried out by using Ar gas until the AlAs layer 105 is exposed (refer to FIG. 9). Although described below, it is necessary to leave the AlAs layer 105 having a sufficient thickness because the AlAs layer 105 is oxidized to be used as an insulation layer, and thus etching is preferably terminated when the upper surface of the AlAs layer 105 is exposed.

Although the dry etching process for a compound semiconductor generally uses a reactive gas such as $Cl_2$ or the like in order to increase the etching rate, in this embodiment, a gas with low reactivity, such as an inert gas or the like, is preferably used. The reason for this is as follows. In this embodiment, etching is terminated when the AlAs layer is exposed in a wide range. However, since the AlAs layer has high reactivity, the use of a gas having high reactivity causes further reaction of the gas remaining on and adhering to the substrate surface in the chamber and the exposed AlAs layer after completion of etching, thereby deteriorating the surface. This danger can be avoided by using gas having low reactivity, such as inert gas such as Ar or the like. On the other hand, the use of a gas without reactivity necessarily decreases the etching rate. However, in this embodiment, a high etching rate is not required because of a small amount of etching, thereby causing no problem.

Figure 10:
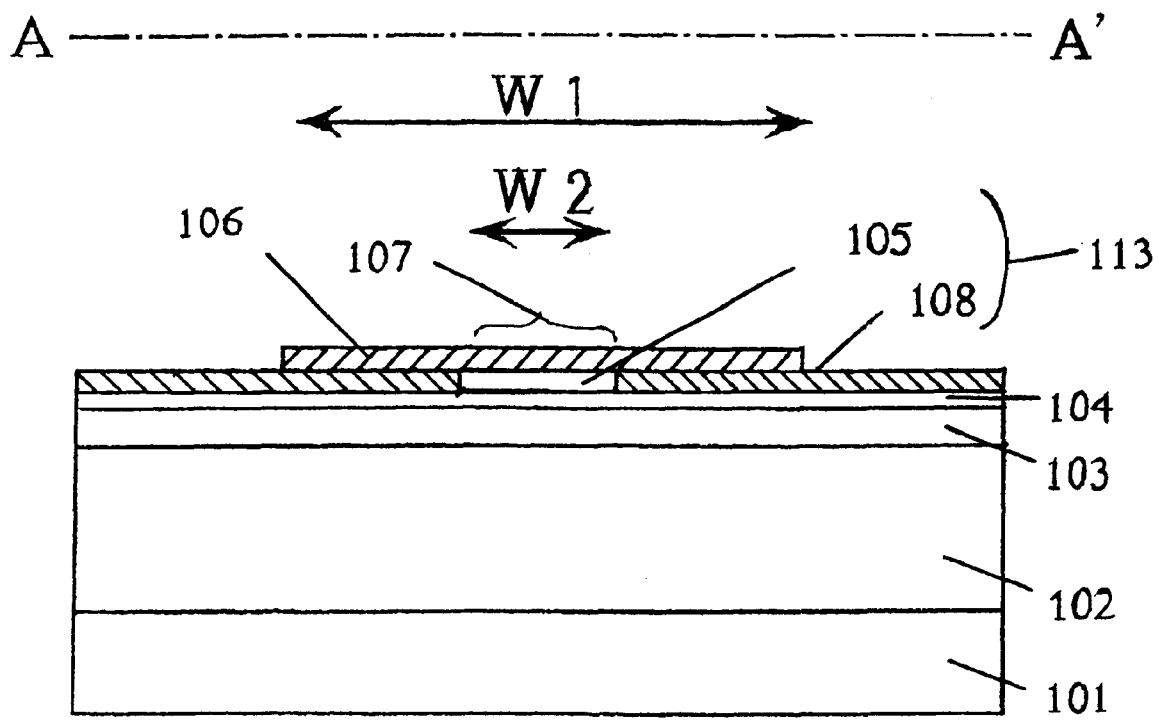
FIG. 10 is a sectional view showing the process for manufacturing the semiconductor laser in accordance with the first embodiment of the present invention.
Figure 11:
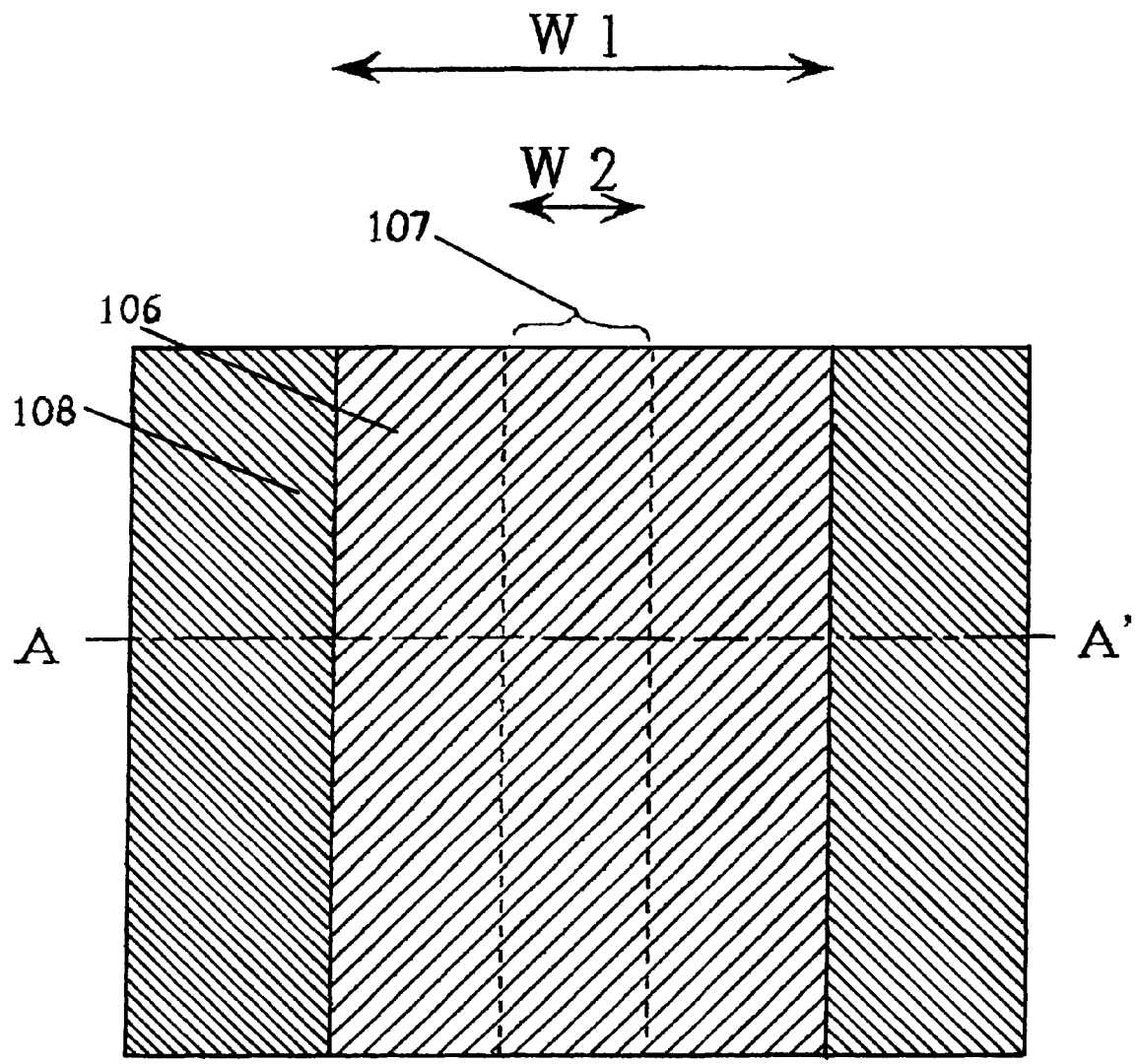
FIG. 11 is a top view showing the process for manufacturing the semiconductor laser in accordance with the first embodiment of the present invention.

Next, the resist mask is removed by using an organic solvent, and the surface is cleaned by $O_2$ ashing, followed by oxidation of the AlAs layer 105 in a nitrogen atmosphere containing water vapor at a temperature of 420° C. This treatment selectively oxidizes only the AlAs layer 105 to convert the AlAs layer 105 to the Al oxide layer 108. Oxidation starts from the exposed portion of the AlAS layer 105, and stops at the interface between the AlAs layer 105 and the clad layer 104. On the other hand, since oxidation also proceeds horizontally, the AlAs layer 105 coated with the contact layer 106 is also oxidized from the coating ends with the passage of time. As a result, the stripe AlAs layer 105 having a width W2 smaller than the width W1 of the contact layer 106 is formed to be surrounded by the Al oxide layer 108. The AlAs layer 105 not oxidized has conductivity, while the Al oxide layer 108 has electrical insulation. Therefore, the currents injected through the contact electrodes and the contact layer, which will be described below, are concentrated in the AlAs layer 105, thereby providing the function as a current narrowing structure. In this embodiment, oxidation is effected to 10 μm horizontally from the coating ends for a treatment time of 20 minutes to form the emission region 107 having a width W2 of 5 μm. FIG. 10 is a sectional view, and FIG. 11 is a top view.

Figure 12:
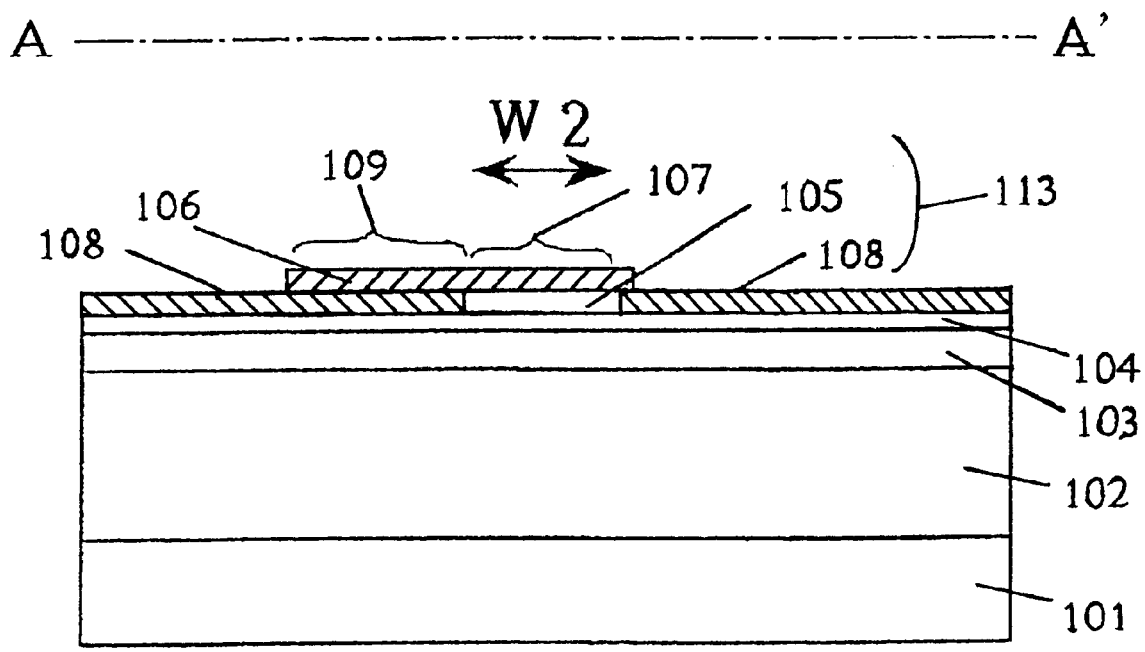
FIG. 12 is a sectional view showing the process for manufacturing the semiconductor laser in accordance with the first embodiment of the present invention.
Figure 13:
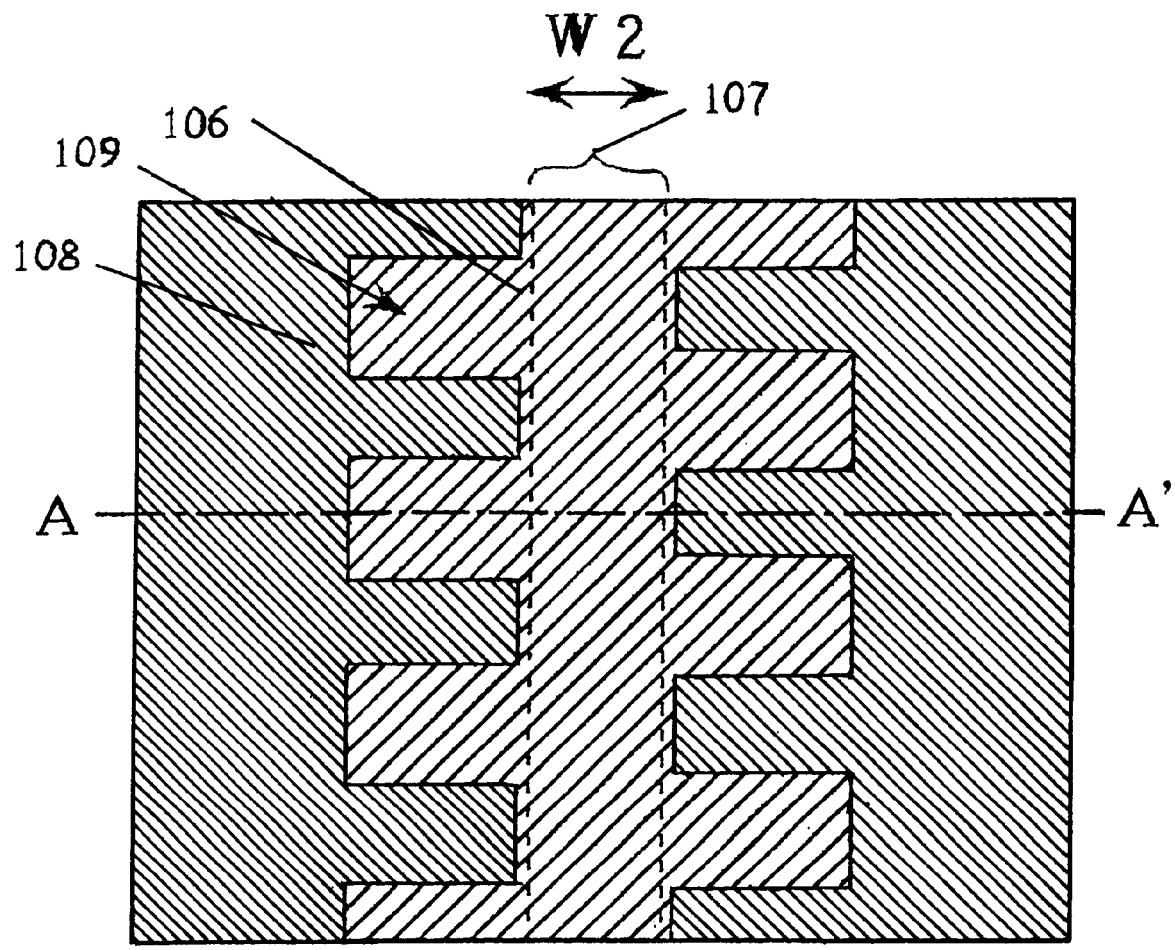
FIG. 13 is a top view showing the process for manufacturing the semiconductor laser in accordance with the first embodiment of the present invention.

Next, a resist mask is formed by photolithography to partially expose only the portion of the contact layer 106, which overlaps the Al oxide layer 108, in a comb shape, and the exposed portion of the contact layer is etched by Ar dry etching. The resist mask is removed to obtain the contact layer 106 formed to cover the emission region and have a comb-shaped region on the Al oxide layer 108. FIG. 12 is a sectional view, and FIG. 13 is a top view.

Next, the contact electrodes 110 are formed by a known vapor deposition method and lift off method. A plurality of the contact electrodes 110 are formed independently to contact the surface of the contact layer, and respectively correspond to the comb teeth 109 of the contact electrodes 106. The contact electrodes 110 are also formed so as not to overlap the emission region 107.

As the material for the contact electrodes 110, Cr, AuZn and Au are used in thicknesses of 10 nm, 100 nm, and 100 nm, respectively. Other materials such as Ti and the like may be used.

Figure 14:
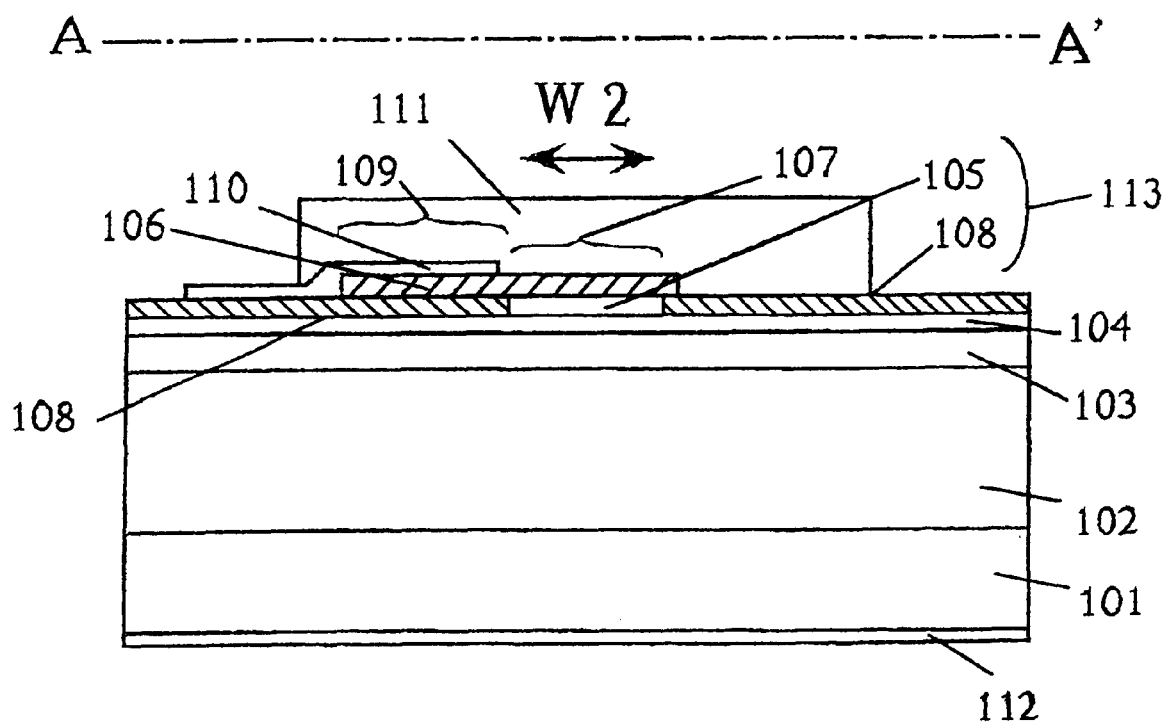
FIG. 14 is a sectional view showing the process for manufacturing the semiconductor laser in accordance with the first embodiment of the present invention.
Figure 15:
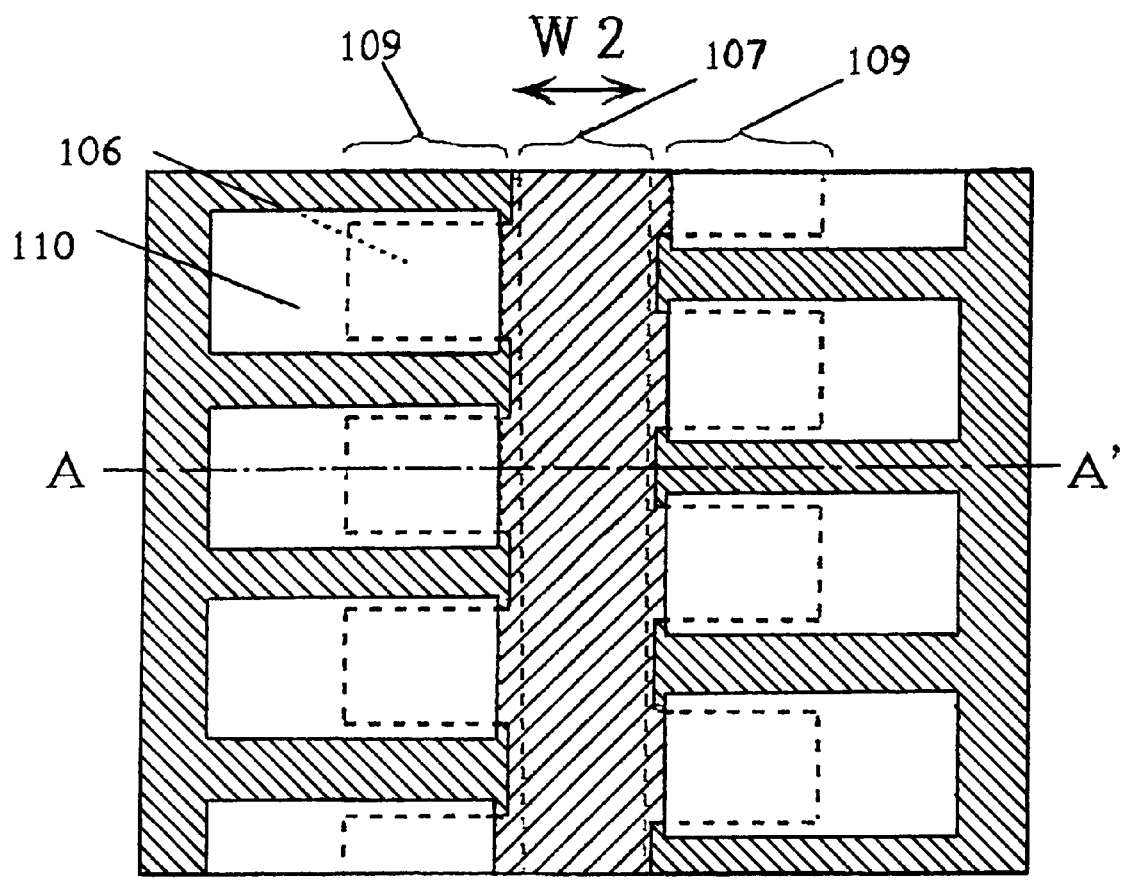
FIG. 15 is a top view showing the process for manufacturing the semiconductor laser in accordance with the first embodiment of the present invention.
Figure 16:
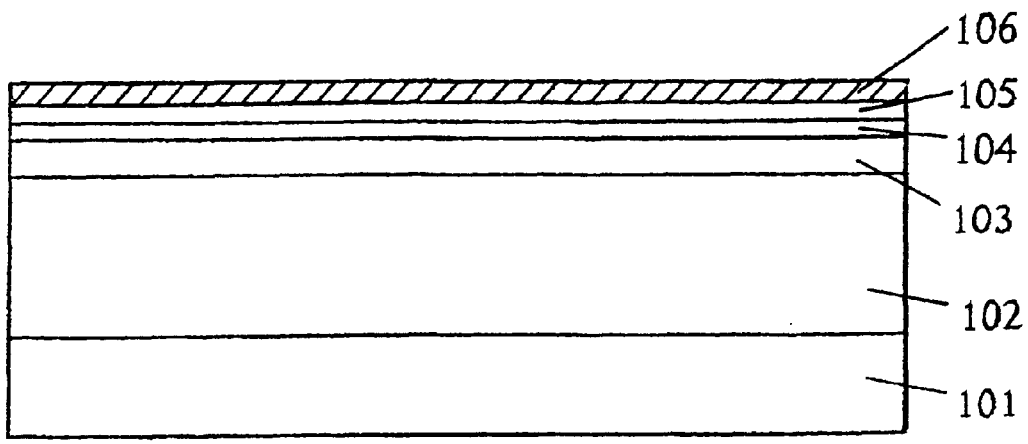
FIG. 16 is a sectional view showing the process for manufacturing a semiconductor laser in accordance with a second embodiment of the present invention.

Then, a dielectric multilayered reflecting film is formed to completely cover at least the stripe emission region 107, to form the second mirror 111. The dielectric multilayered reflecting film is formed by laminating 7 pairs of $SiO_2$ and $Ta_2O_5$. Other dielectric materials such as $TiO_2$, ZnSe, MgF, $A_2O_3$, and the like may be used. Then, the lower electrode 112 made of Au-GeNiAu is formed below the n-type GaAs substrate 101. FIG. 14 is a sectional view, and FIG. 15 is a top view.

Although, in this embodiment, the electrodes are arranged in a staggered form, the electrodes may be arranged opposite to each other. Although the divided electrodes are formed on both sides of the stripe laser emission region, the electrodes may be formed on one of the sides.

Although the AlGaAs system semiconductor laser has been described above, of course, other materials such as AlGaInP system, InGaAs system, ZnMgSSe system, ZnSSe system, GaN system materials, and the like may be used.

Second Embodiment

The method of manufacturing a surface emission type semiconductor laser in accordance with a second embodiment of the present invention will be described below with reference to FIGS. 16 to 22.

First, 30 pairs of n-type $Al_{0.15}Ga_{0.85}As$ and a n-type AlAs layers are alternately laminated on a n-type GaAs substrate 101 to have a reflectance of 99% or more in the vicinity of the laser oscillation wavelength to form a first reflecting mirror 102, and 5 layers each of a quantum well layer made of n-type GaAs and a barrier layer made of n-type $Al_{0.3}Ga_{0.7}As$ are alternately laminated to form an active layer 103. Then, a second conductive type clad layer 104 made of p-type $Al_{0.7}Ga_{0.3}As$, a p-type AlAs layer 105, and a contact layer 106 made of p-type $Al_{0.15}Ga_{0.85}As$ are laminated in turn on the substrate 101 (refer to FIG. 16).

Each of these layers is epitaxially grown by an organometal vapor phase growth method. For example, this epitaxial growth is performed by using organometals TMGa (trimethylgallium) and TMAl (trimethylaluminum) as III-group raw materials, $AsH_3$ (arsine) as a V-group raw material, $H_2Se$ (hydrogen selenide) as a n-type dopant, and DEZn (diethylzinc) as a p-type dopant at a growth temperature of 750° C. and a growth pressure of 150 Torr.

After the layers are successively laminated, a resist mask is formed in a stripe having comb-shaped portions on both sides thereof on the contact layer 106 by photolithography.

Figure 17:
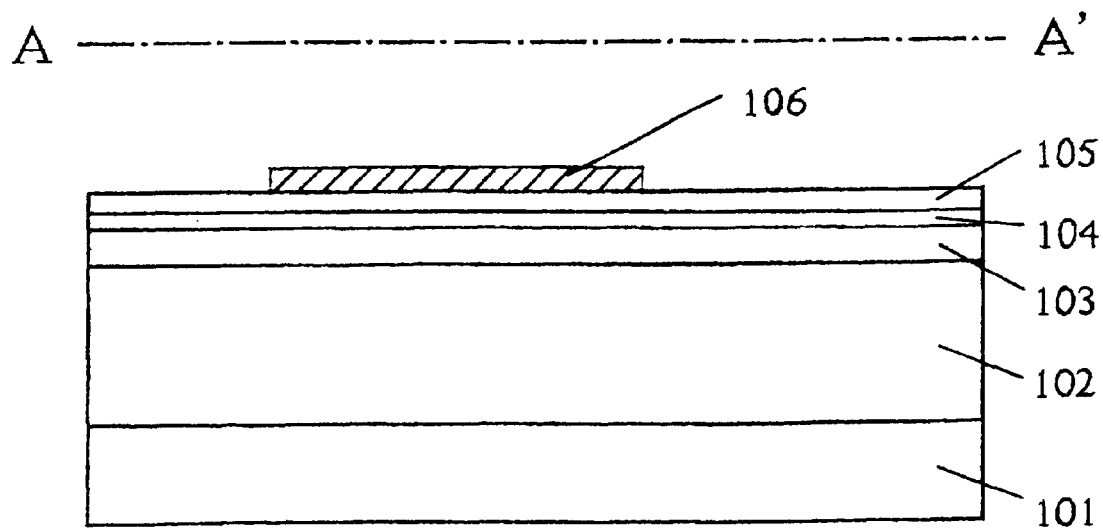
FIG. 17 is a sectional view showing the process for manufacturing the semiconductor laser in accordance with the second embodiment of the present invention.
Figure 18:
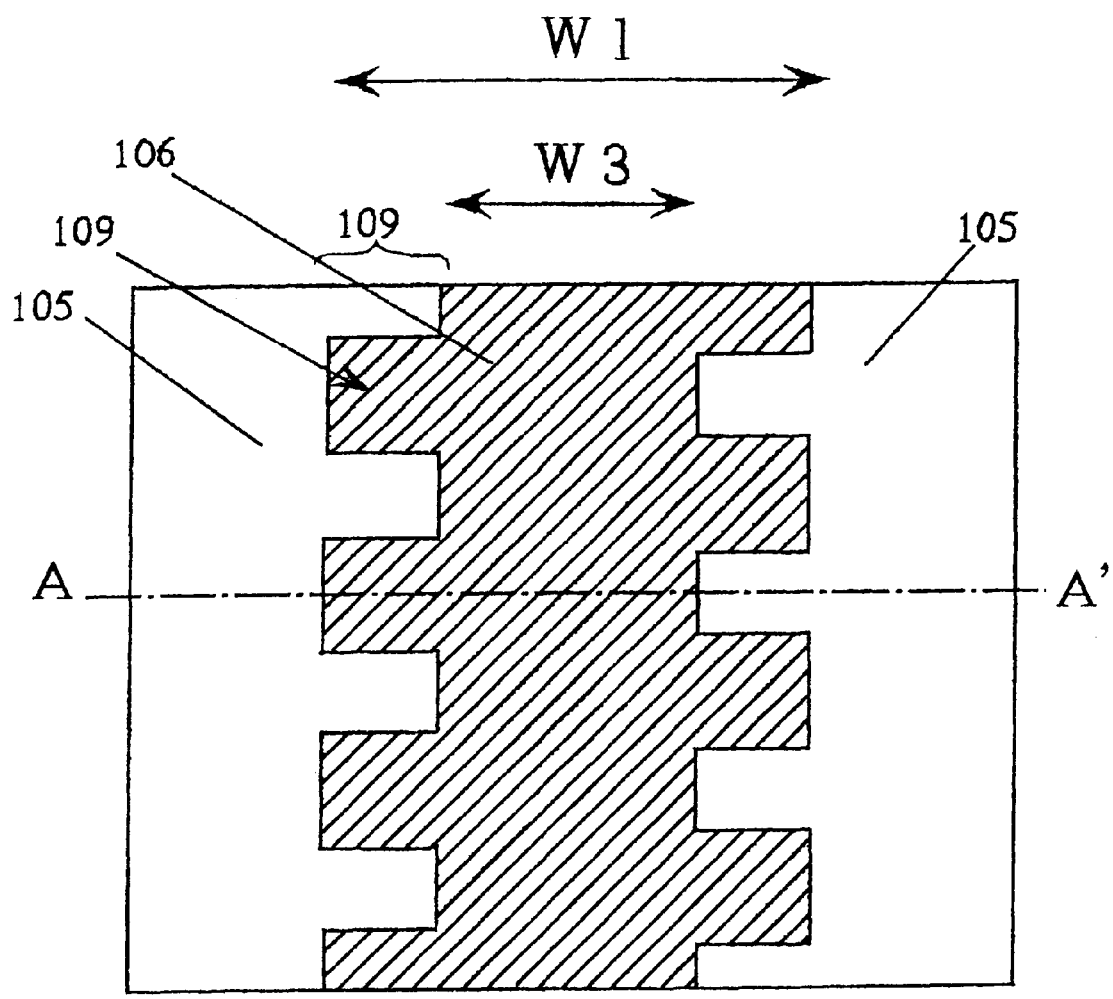
FIG. 18 is a top view showing the process for manufacturing the semiconductor laser in accordance with the second embodiment of the present invention.

Then, dry etching is carried out to an intermediate position of the AlAs layer 105 by using Ar gas (refer to FIG. 17). FIG. 18 shows the shape of the stripe. Although described below, it is necessary to leave the AlAs layer 105 having a sufficient thickness because the AlAs layer 105 is oxidized to be used as an insulation layer, and thus etching is preferably terminated when the upper surface of the AlAs layer 105 is exposed. Although this embodiment uses Ar ion beam etching, other etching methods may be used.

Although the dry etching process for a compound semiconductor generally uses a reactive gas such as $Cl_2$ or the like in order to increase the etching rate, in this embodiment, a gas with low reactivity, such as an inert gas or the like, is preferably used. The reason for this is as follows. In this embodiment, etching is terminated when the AlAs layer is exposed in a wide range. However, since the AlAs layer has high reactivity, the use of a gas having high reactivity causes further reaction of the gas remaining on and adhering to the substrate surface in the chamber and the exposed AlAs layer after completion of etching, thereby deteriorating the surface. This danger can be avoided by using gas having low reactivity, such as inert gas such as Ar or the like. On the other hand, the use of a gas without reactivity necessarily decreases the etching rate. However, in this embodiment, a high etching rate is not required because of a small amount of etching, thereby causing no problem.

Figure 19:
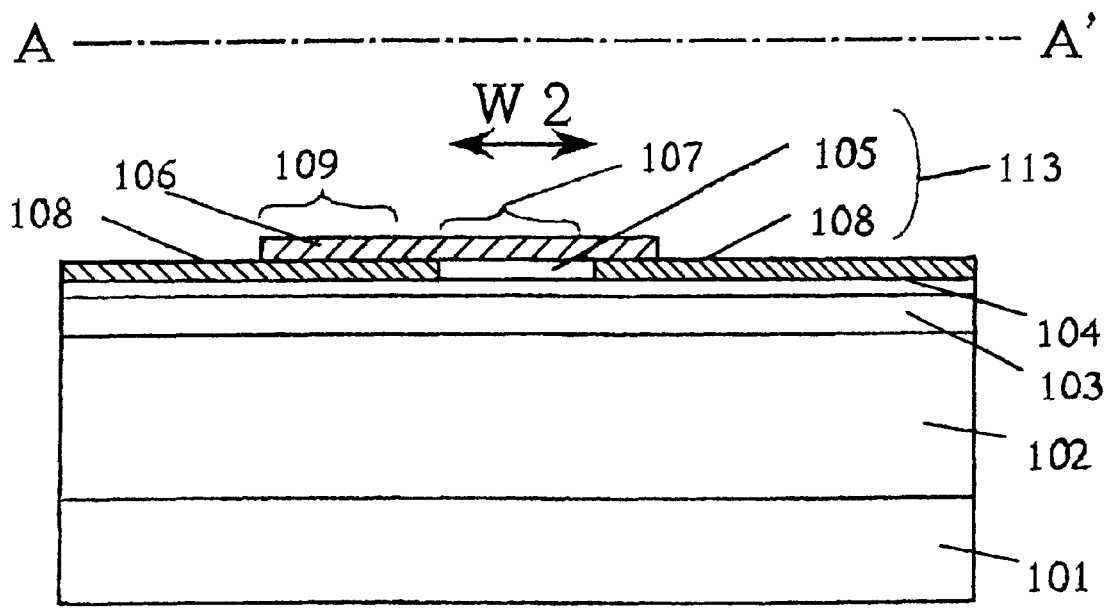
FIG. 19 is a sectional view showing the process for manufacturing the semiconductor laser in accordance with the second embodiment of the present invention.
Figure 20:
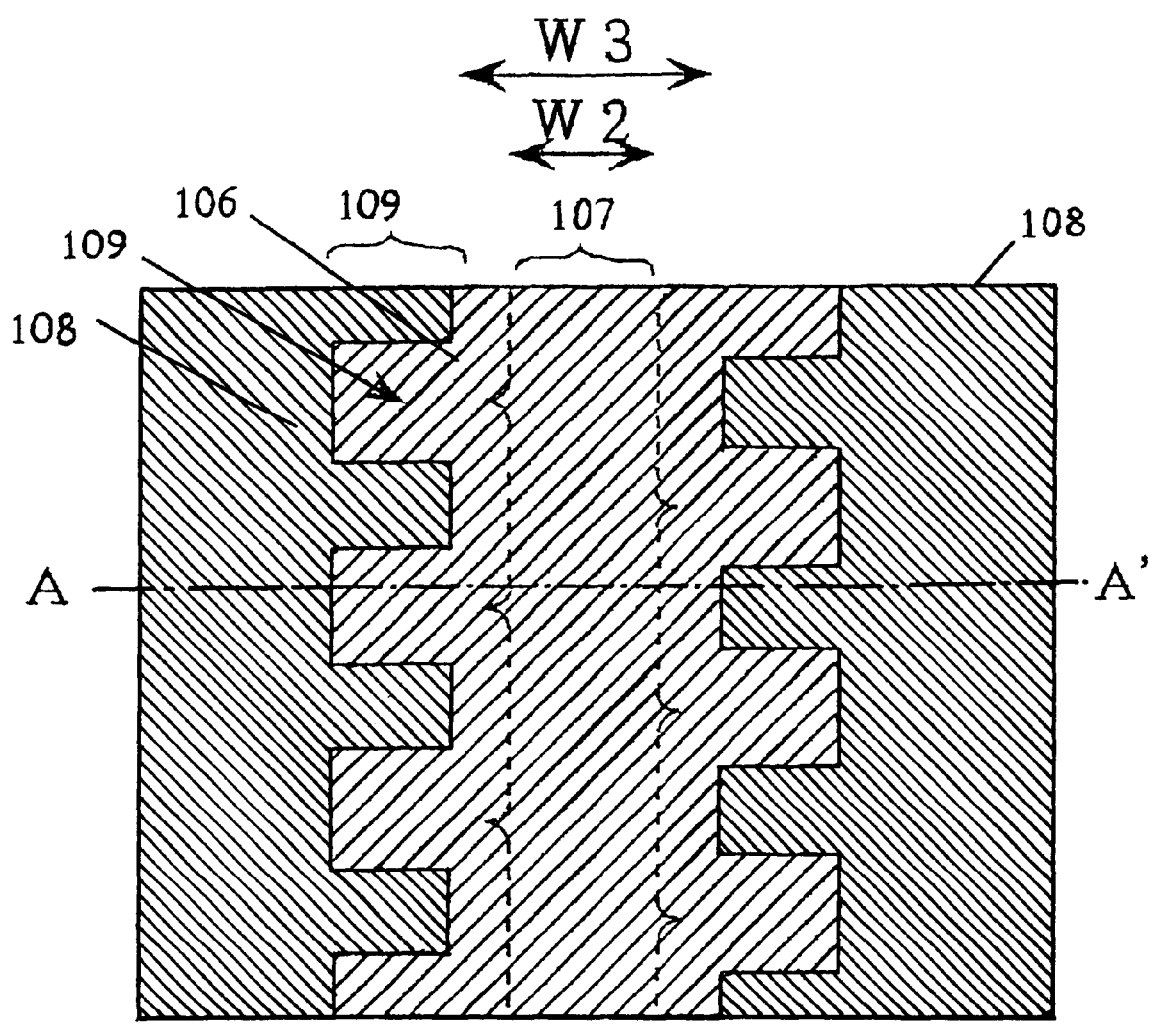
FIG. 20 is a top view showing the process for manufacturing the semiconductor laser in accordance with the second embodiment of the present invention.

Next, the resist mask is removed by using an organic solvent, and the surface is cleaned by $O_2$ ashing, followed by oxidation of the AlAs layer 105 in a nitrogen atmosphere containing water vapor at a temperature of 420° C. This treatment selectively oxidizes only the AlAs layer 105 to convert the AlAs layer 105 to the Al oxide layer 108. Oxidation starts from the exposed portion of the AlAS layer 105, and stops at the interface between the AlAs layer 105 and the first clad layer. On the other hand, since oxidation also proceeds horizontally, the AlAs layer 105 coated with the contact layer 106 is also oxidized from the coating ends with the passage of time. As a result, the stripe AlAs layer 105 having a width W2 smaller than the width W3 of the contact layer 106 is formed to be surrounded by the Al oxide layer 108. The AlAs layer 105 not oxidized has conductivity, while the Al oxide layer 108 has electrical insulation. Therefore, the currents injected through the contact electrodes and the contact layer, which will be described below, are concentrated in the AlAs layer 105, thereby providing the function as a current narrowing structure. In this embodiment, oxidation is effected to 2.5 μm horizontally from the coating ends at a temperature of 400° C. for a treatment time of 50 minutes to form the emission region 107 having a width W2 of 5 μm. FIG. 19 is a sectional view, and FIG. 20 is a top view.

Next, the contact electrodes 110 in contact with contact layer 106 are formed by a known vapor deposition method and lift off method. A plurality of the contact electrodes 110 are formed independently to contact the surface of the contact layer 106, and respectively correspond to the comb teeth 109 of the contact electrodes 110. The contact electrodes 110 are also formed so as not to overlap the emission region 107.

As the material for the contact electrodes 110, Cr, AuZn and Au are used in thicknesses of 10 nm, 100 nm, and 100 nm, respectively. Other materials such as Ti and the like may be used.

Figure 21:
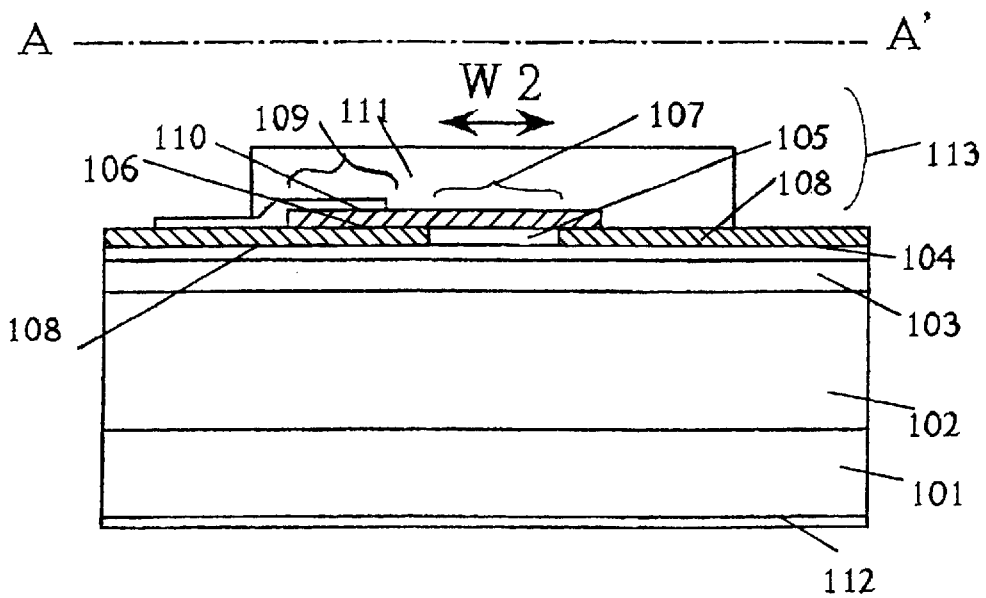
FIG. 21 is a sectional view showing the process for manufacturing the semiconductor laser in accordance with the second embodiment of the present invention.
Figure 22:
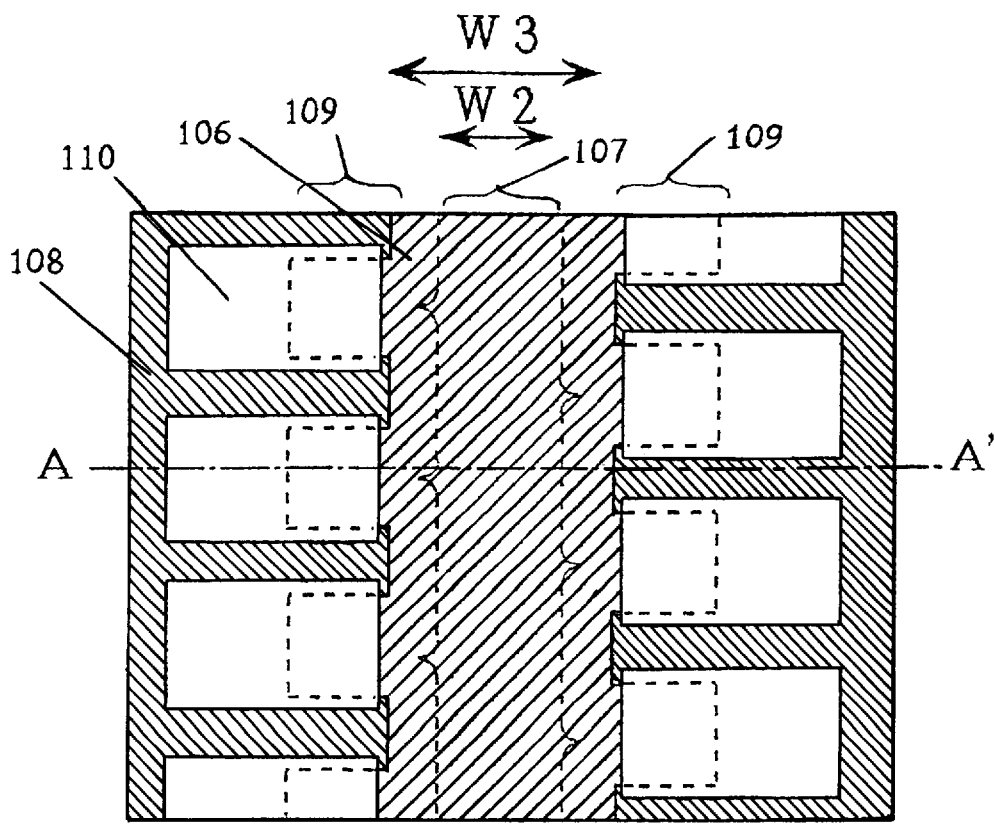
FIG. 22 is a top view showing the process for manufacturing the semiconductor laser in accordance with the second embodiment of the present invention.

Then, a dielectric multilayered reflecting film is formed to completely cover at least the stripe emission region 107, to form the second mirror 111. The dielectric multilayered reflecting film is formed by laminating 7 pairs of $SiO_2$ and $Ta_2O_5$. Other dielectric materials such as $TiO_2$, ZnSe, MgF, $Al_2O_3$, and the like may be used. Then, the lower electrode 112 made of Au-GeNiAu is formed below the n-type GaAs substrate 101. FIG. 21 is a sectional view, and FIG. 22 is a top view.

Although the AlGaAs system semiconductor laser has been described above, of course, other materials such as AlGaInP system, InGaAs system, ZnMgSSe system, ZnSSe system, GaN system materials, and the like may be used.

This method permits omission of the step of forming the comb-shaped contact layer after the step of forming the Al oxide layer, and thus the method is simple as the manufacturing process, as compared with the first embodiment. However, the shape of the emission region and the shape of the contact layer cannot be independently selected, thereby limiting the width of the emission region and the electrode pitch. In addition, since the bottoms of the comb teeth of the contact layer are necessarily joined to each other in the region on the Al oxide layer, the independence of the comb teeth cannot be maintained, thereby causing the drawback that the current in the direction of the stripe length cannot be sufficiently confined.

Third Embodiment

Figure 23:
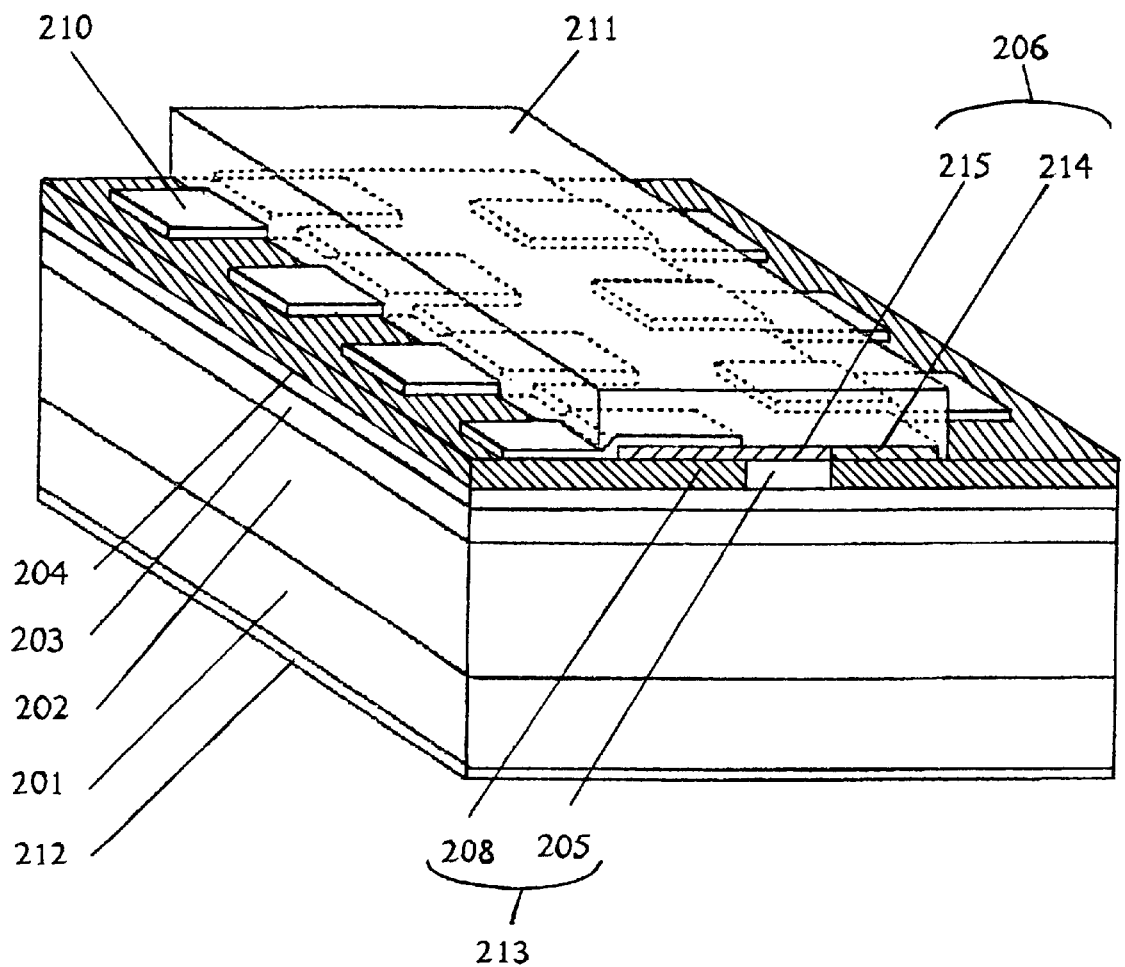
FIG. 23 is a schematic perspective view of a semiconductor laser in accordance with a third embodiment of the present invention.
Figure 24:
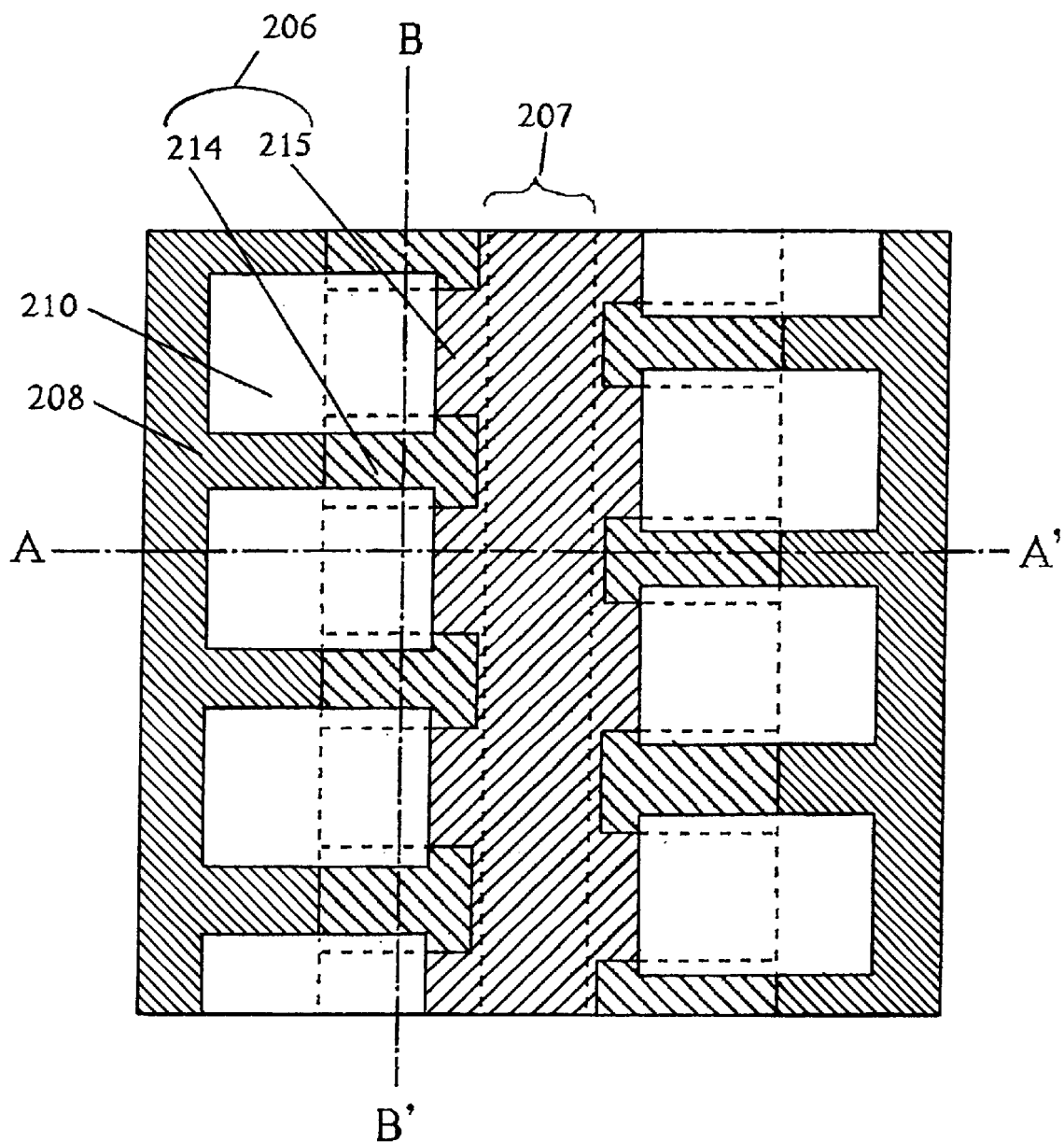
FIG. 24 is a top view of the device of FIG. 23.
Figure 25:
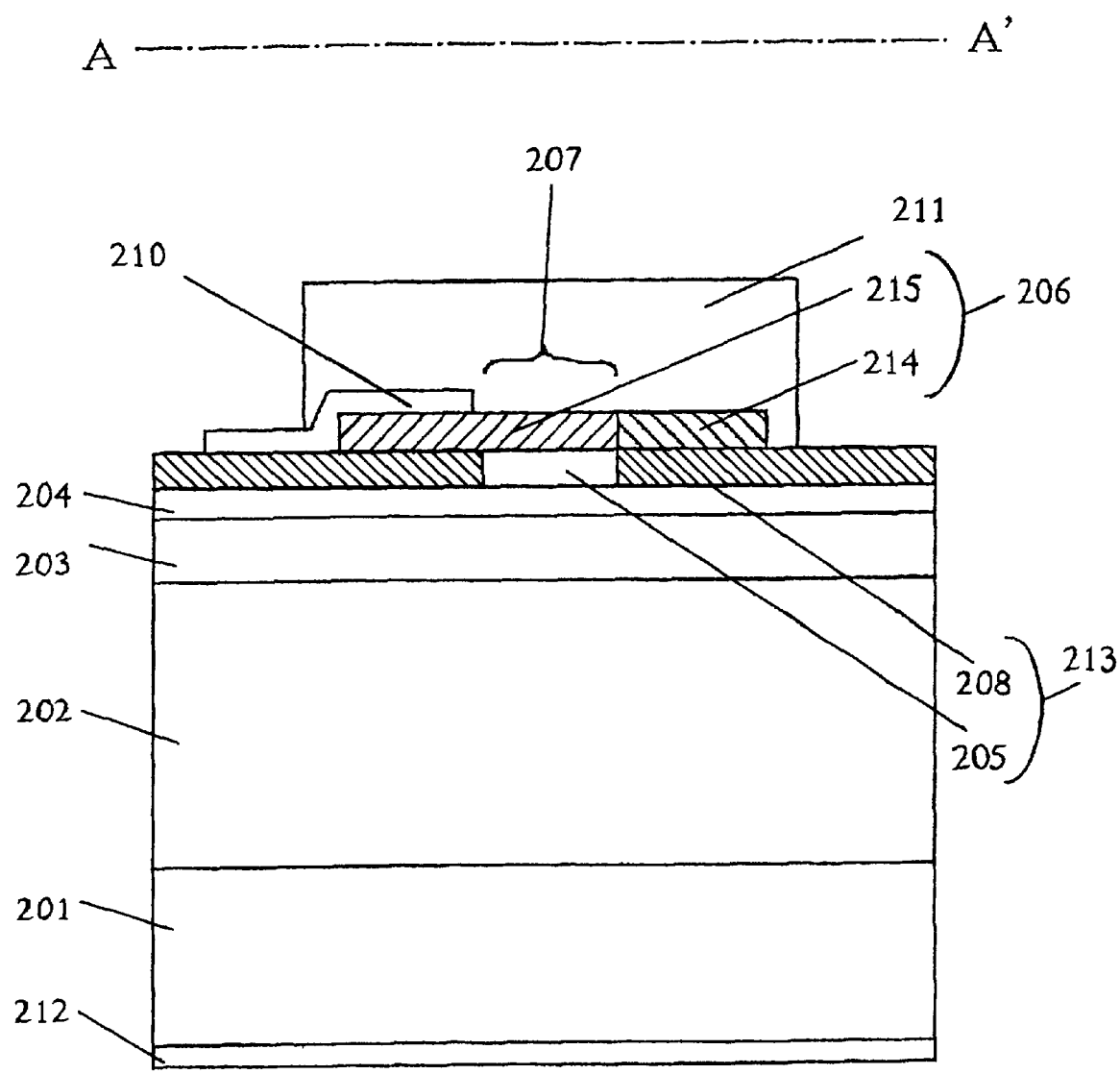
FIG. 25 is a sectional view of the device of FIG. 23.
Figure 26:
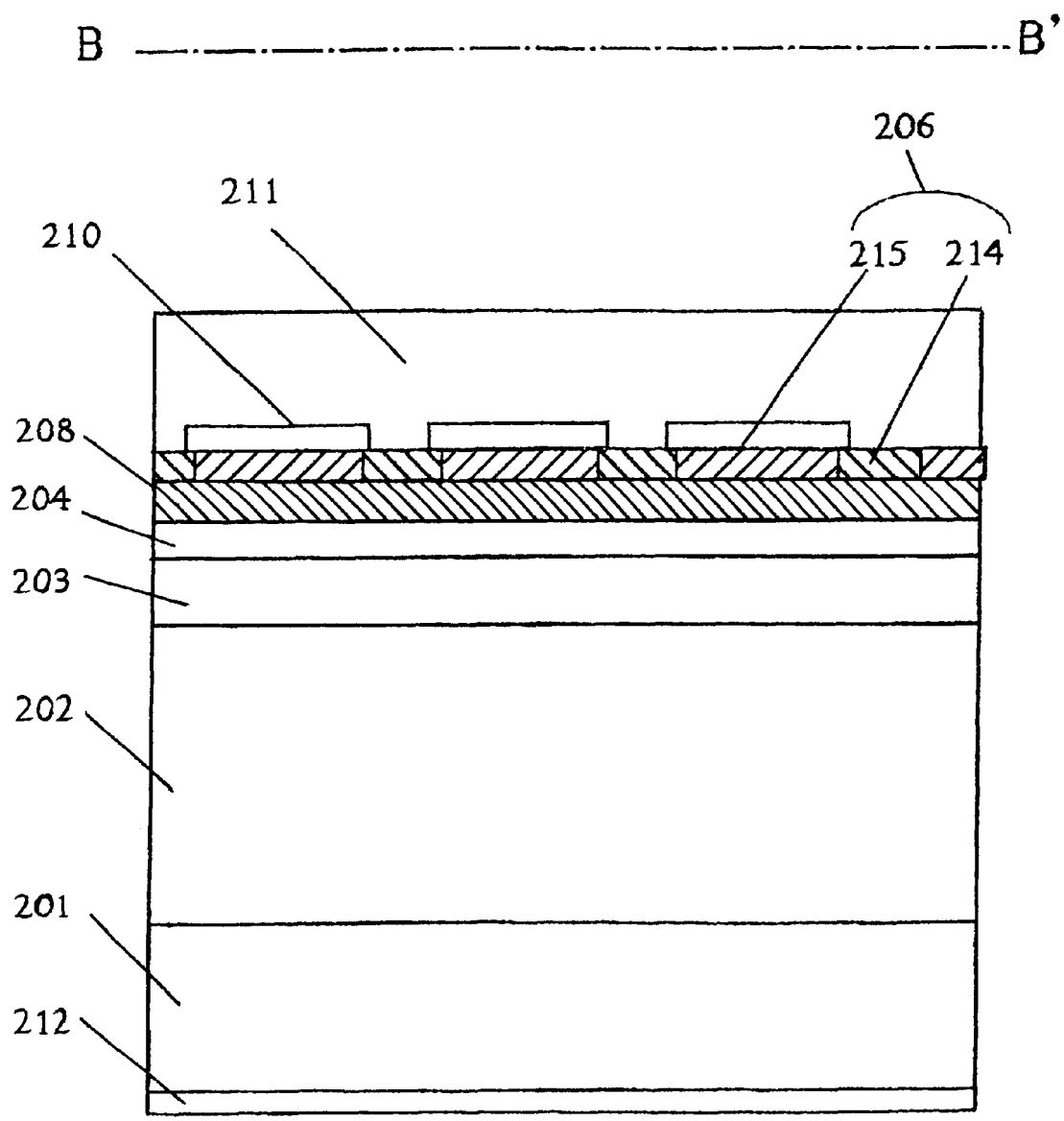
FIG. 26 is a sectional view of the device of FIG. 23.

FIGS. 23 to 26 are schematic drawings of a surface emission type semiconductor laser in accordance with a third embodiment of the present invention. FIG. 23 is a perspective view schematically showing a section of the same laser, FIG. 24 is a top view, and FIGS. 25 and 26 are sectional views taken along lines AA' and BB', respectively. However, in FIG. 24, the second mirror 211 is omitted in order to clearly show the arrangement of a contact layer 206, an emission region 207, and contact electrodes 210, which will be described below.

The surface emission type semiconductor laser comprises distributed reflection type semiconductor multilayered reflection layers (referred to as a "first mirror" hereinafter) 202 formed by alternately laminating 30 pairs of n-type $Al_{0.15}Ga_{0.85}As$ and a n-type AlAs layers on a n-type GaAs substrate 201 to have a reflectance of 99% or more at a wavelength of 800 nm, an active layer 203 formed by alternately laminating 5 layers each of a quantum well layer made of GaAs and a barrier layer made of $Al_{0.3}Ga_{0.7}As$, a clad layer 204 made of p-type $Al_{0.7}Ga_{0.3}As$, a current narrowing layer 213 comprising a p-type AlAs layer 205 and an Al oxide layer 208, a contact layer 206 made of $Al_{0.15}Ga_{0.85}As$ and having two types of conduction regions including a n-type region 214 and a high-concentration p-type region 215, contact electrodes 210 in contact with the high-concentration p-type region 215 of the contact layer, and a dielectric multilayered reflection film (referred to as a "second mirror" hereinafter) 211 formed by alternately laminating 7 pairs of $SiO_2$ and $Ta_2O_5$ to have a reflectance of 98.5 to 99% for light near a wavelength of 800 nm, all of which are laminated in turn on the substrate 201 (refer to FIG. 23).

The current narrowing layer 213 comprises the stripe p-type AlAs layer 205, and the Al oxide layer 208 formed to surround the AlAs layer 205. The AlAs layer 205 has conductivity, while the Al oxide layer 208 is an insulator and thus functions as a stripe current narrowing structure. Hereinafter, a stripe region where the AlAs layer 205 is present is referred to as an "emission region 207" (refer to FIGS. 24 and 25).

This embodiment is characterized in that the contact layer 206 comprises two types of conduction regions including the n-type region 214 and the high-concentration p-type region 215. The high-concentration p-type region 215 is formed in the portion which covers the emission region 207, and the high-concentration p-type region 215 and the n-type region 214 are alternately formed in the region on the Al oxide layer 208 in the direction of the stripe length (refer to FIG. 24).

For example, the contact electrodes 210 made of Cr and an Au-Zn alloy are formed to respectively contact the surfaces of the high-concentration p-type regions 215 separated by the n-type regions 214 of the contact layer 206 on the Al oxide layer 208. A plurality of the contact electrodes 210 are independently formed to respectively correspond to the high-concentration p-type regions 215 of the contact layer 206 on the Al oxide layer 208. The contact electrodes 210 are not formed on the emission region 207 (refer to FIGS. 24, 25 and 26).

The second mirror 210 is formed to completely cover at least the stripe emission region 207.

An electrode (referred to as a "lower electrode" hereinafter) 212 made of, for example, an Au-Ge alloy, Ni and Au is formed below the n-type GaAs substrate 201.

The present invention is not limited to this embodiment, and various modified embodiments can be made within the scope of the gist of the invention.

Although, in this embodiment, an AlGaAs system semiconductor material is used for the semiconductor substrate, the first mirror, the active layer, and the contact layer, the present invention is not limited to these materials. Of course, other materials such as AlGaInP system, InGaAsP system, InGaAs system, ZnSSe system, ZnMgSSe system semiconductor materials, and the like can also be used.

Although, in this embodiment, the AlAs layer 208 and the contact layer 206 are formed to contact each other, another semiconductor layer may be provided between the AlAs layer 208 and the contact layer 206. For example, a semiconductor multilayered reflection film may be provided.

The conduction types of the semiconductors may be reversed.

Although the dielectric multilayered reflection film formed by using $SiO_2$ and $Ta_2O_5$ as materials is used as the second mirror, other dielectric materials such as $TiO_2$, ZnSe, MgF, $Al_2O_3$, and the like may be used.

Oscillating Operation of Laser

The surface emission type semiconductor laser of this embodiment is the same as the first embodiment in that the current passage in the contact layer is controlled to effectively lead currents to the stripe emission region 207, and that current spreading in the stripe emission region 207 in the direction of the stripe length can be suppressed to increase the current density, thereby significantly decreasing reactive currents. However, this embodiment is characterized by the method of suppressing current spreading in the direction of the stripe length.

Figure 27:
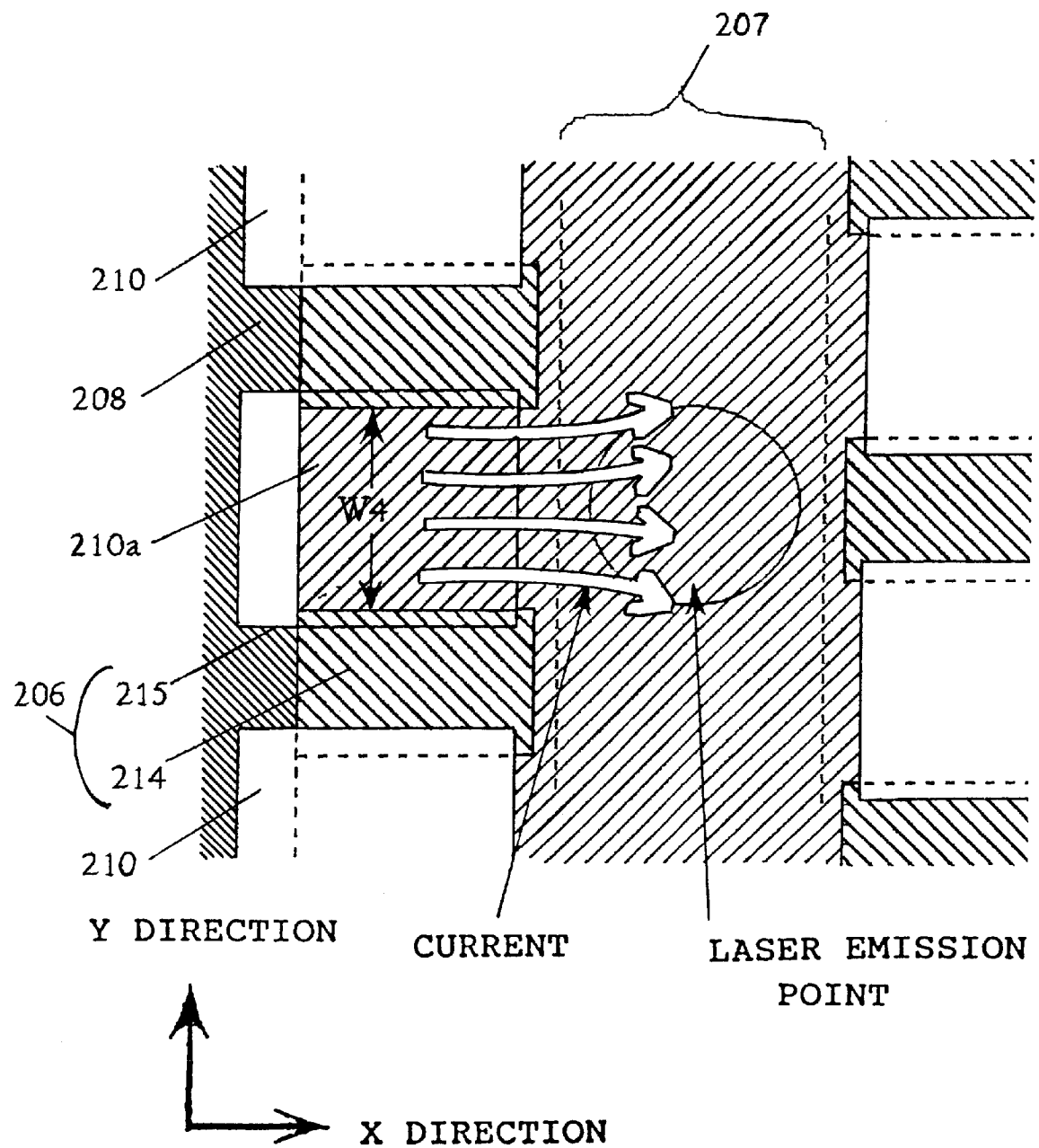
FIG. 27 is a top view schematically showing current flows in the semiconductor laser in accordance with the third embodiment of the present invention.
Figure 28:
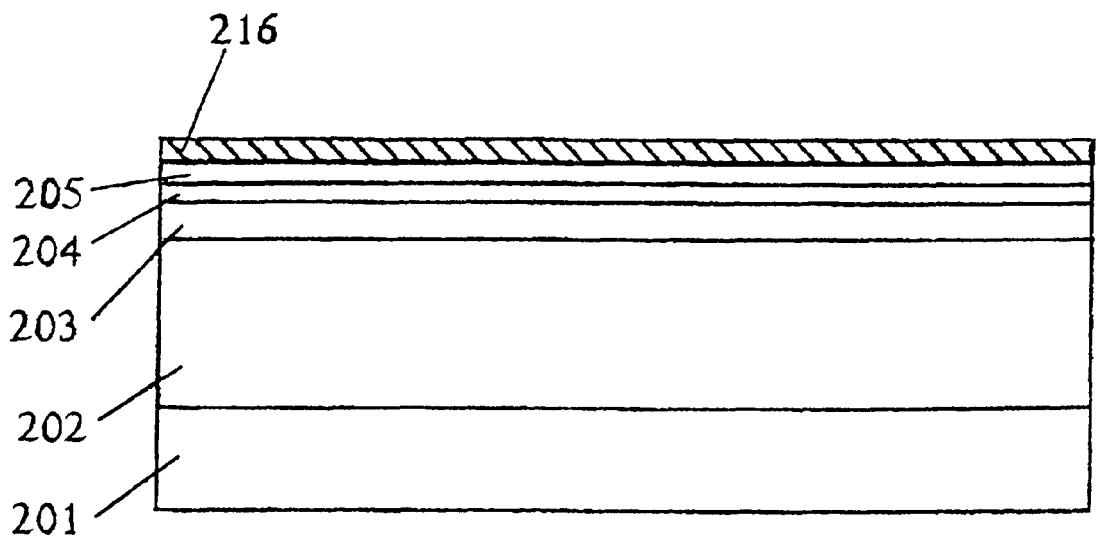
FIG. 28 is a sectional view showing the process for manufacturing the semiconductor laser in accordance with the third embodiment of the present invention.
Figure 29:
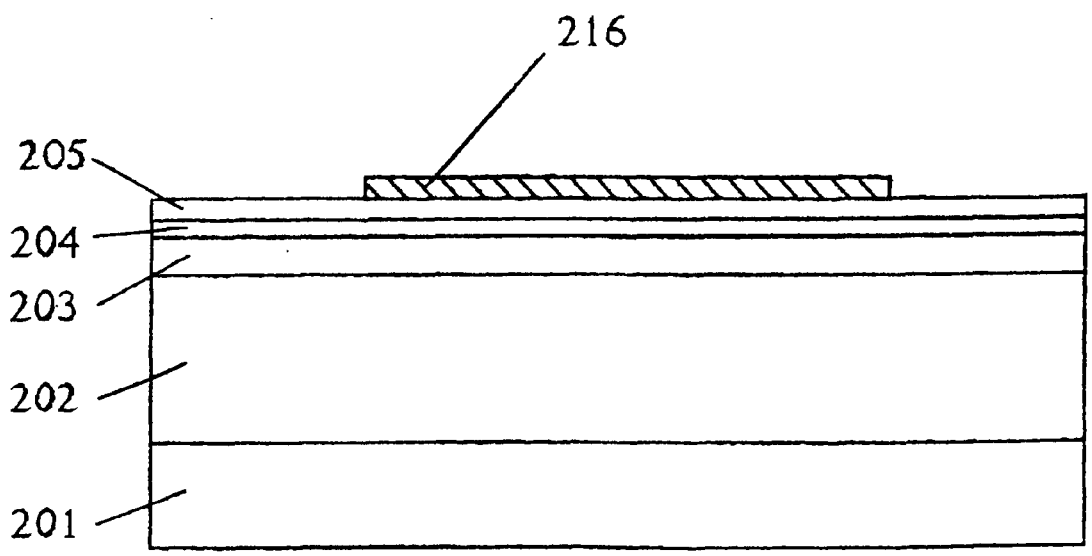
FIG. 29 is a sectional view showing the process for manufacturing the semiconductor laser in accordance with the third embodiment of the present invention.

This will be described in detail below with reference to FIG. 27. FIG. 27 is an enlarged top view of the vicinity of the emission region of this embodiment, which schematically shows current flows. However, in this figure, the contact electrodes and the second mirror are omitted in order to clearly show the current flows in the contact layer.

This embodiment is characterized in that the contact layer 206 comprises the two types of conduction regions, i.e., the n-type region 214 and the high-concentration p-type region 215. The n-type region 214 and the high-concentration p-type region 215 are alternately formed in the portion of the contact layer 206, which is formed on the Al oxide layer 208, in the direction of the stripe length, and a plurality of the contact electrodes 210 are formed independently for the respective high-concentration p-type regions 215 of the contact layer on the Al oxide layer 208. When a current is passed through one contact electrode 210a, the current is injected into only the high-concentration p-type region 215 because the contact electrode is put into ohmic contact with a p-type semiconductor. At this time, the charge medium of the current in the high-concentration p-type region 215 of the contact layer comprises holes. On the other hand, since a potential barrier is formed in the valence band in the boundary between the p-type region 215 and the n-type region 214, the holes are confined in the p-type region 215. Namely, the current does not flow to the n-type region 214 in the contact layer 206. Therefore, currents are confined in the range of the p-type region 215 having the width W4 in the Y direction shown in FIG. 27 up to a portion near the emission region 207, as shown in FIG. 27. As a result, current spreading in the direction of the stripe length can be suppressed to increase the current density, thereby decreasing the threshold value and improving efficiency.

Manufacturing Method

The manufacturing method is described below with reference to FIGS. 28 to 37. First, 30 pairs of n-type $Al_{0.15}Ga_{0.85}As$ and n-type AlAs layers are alternately laminated on the n-type GaAs substrate 201 to form the first reflecting mirror 202 having a reflectance of 99% or more at 800 nm. Five layers each of the quantum well layer made of n-type GaAs, and the barrier layer made of n-type $Al_{0.3}Ga_{0.7}As$ are alternately laminated to form the active layer 203. Then, the second conductive type clad layer 204 made of p-type $Al_{0.7}Ga_{0.3}As$, the p-type AlAs layer 205, and the semiconductor layer 216 made of n-type $Al_{0.15}Ga_{0.85}As$ are laminated in turn (refer to FIG. 28).

The carrier concentration of the n-type semiconductor later 216 is $1\times10^{17}$ $cm^{-3}$ or less. The carrier concentration of the n-type semiconductor later 216 is preferably $1\times10^{17}$ $cm^{-3}$ or less, more preferably $1\times10^{16}$ $cm^{-3}$ or less.

Each of these layers is epitaxially grown by an organometal vapor phase growth method. For example, this epitaxial growth is performed by using organic metals TMGa (trimethylgallium) and TMAl (trimethylaluminum) as III-group raw materials, $ASH_3$ (arsine) as a V-group raw material, $H_2Se$ (hydrogen selenide) as an n-type dopant, and DEZn (diethylzinc) as a p-type dopant at a growth temperature of 750° C. and a growth pressure of 150 Torr.

After the layers are successively laminated, a stripe resist mask is formed on the n-type semiconductor layer 216 by photolithography. The stripe width W1 is 25 μm. Then, dry etching is carried out by using Ar gas until the AlAs layer 205 is exposed (refer to FIG. 29). Although described below, it is necessary to leave the AlAs layer 205 having a sufficient thickness because the AlAs layer 205 is oxidized to be used as an insulation layer, and thus etching is preferably terminated when the upper surface of the AlAs layer 105 is exposed.

Although the dry etching process for a compound semiconductor generally uses a reactive gas such as $Cl_2$ or the like in order to increase the etching rate, in this embodiment, a gas with low reactivity, such as an inert gas or the like, is preferably used. The reason for this is as follows. In this embodiment, etching is terminated when the AlAs layer is exposed in a wide range. However, since the AlAs layer has high reactivity, the use of a gas having high reactivity causes further reaction of the gas remaining on and adhering to the substrate surface in the chamber and the exposed AlAs layer after completion of etching, thereby deteriorating the surface. This danger can be avoided by using gas having low reactivity, such as inert gas such as Ar or the like. On the other hand, the use of a gas without reactivity necessarily decreases the etching rate. However, in this embodiment, a high etching rate is not required because of a small amount of etching, thereby causing no problem.

Figure 30:
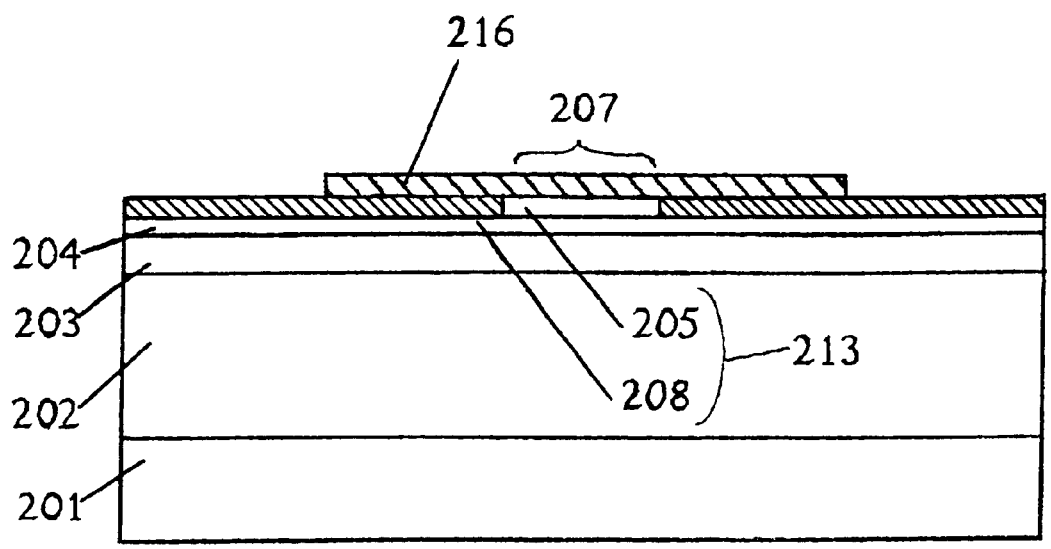
FIG. 30 is a sectional view showing the process for manufacturing the semiconductor laser in accordance with the third embodiment of the present invention.
Figure 31:
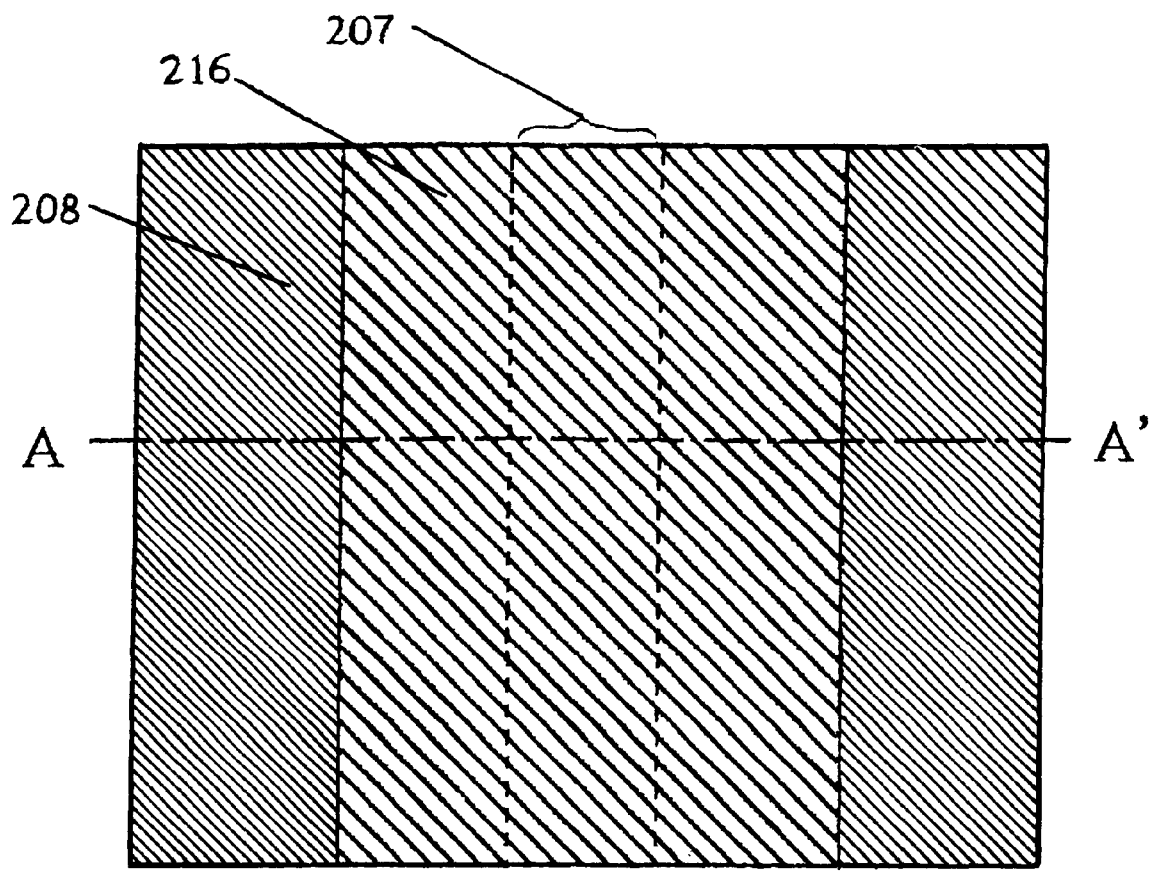
FIG. 31 is a top view showing the process for manufacturing the semiconductor laser in accordance with the third embodiment of the present invention.

Next, the resist mask is removed by using an organic solvent, and the surface is cleaned by $O_2$ ashing, followed by oxidation of the AlAs layer 105 in a nitrogen atmosphere containing water vapor at a temperature of 420° C. This treatment selectively oxidizes only the AlAs layer 205 to convert the AlAs layer 205 to the Al oxide layer 208. Oxidation starts from the exposed portion of the AlAs layer 205, and stops at the interface between the AlAs layer 205 and the clad layer 204. On the other hand, since oxidation also proceeds horizontally, the AlAs layer 205 coated with the n-type semiconductor layer 216 is also oxidized from the coating ends with the passage of time. As a result, the stripe AlAs layer 205 having a width smaller than the width of the n-type semiconductor layer 216 is formed to be surrounded by the Al oxide layer 208. The AlAs layer 205 not oxidized comprises a p-type semiconductor and thus has conductivity, while the Al oxide layer 208 has electrical insulation. Therefore, the currents injected through the contact electrodes and the contact layer, which will be described below, are concentrated in the AlAs layer 205, thereby providing the function as a current narrowing structure. In the region where the injected currents are concentrated, laser oscillation results from light generation due to recombination of carriers, and the amplifying function of an optical resonance structure to emit a laser beam. The region where currents are concentrated is referred to as the emission region 207. In this embodiment, oxidation is effected to 10 μm horizontally from the contact coating ends for a treatment time of 20 minutes to form the emission region 207 having a width of 5 μm. FIG. 30 is a sectional view, and FIG. 31 is a top view.

Figure 32:
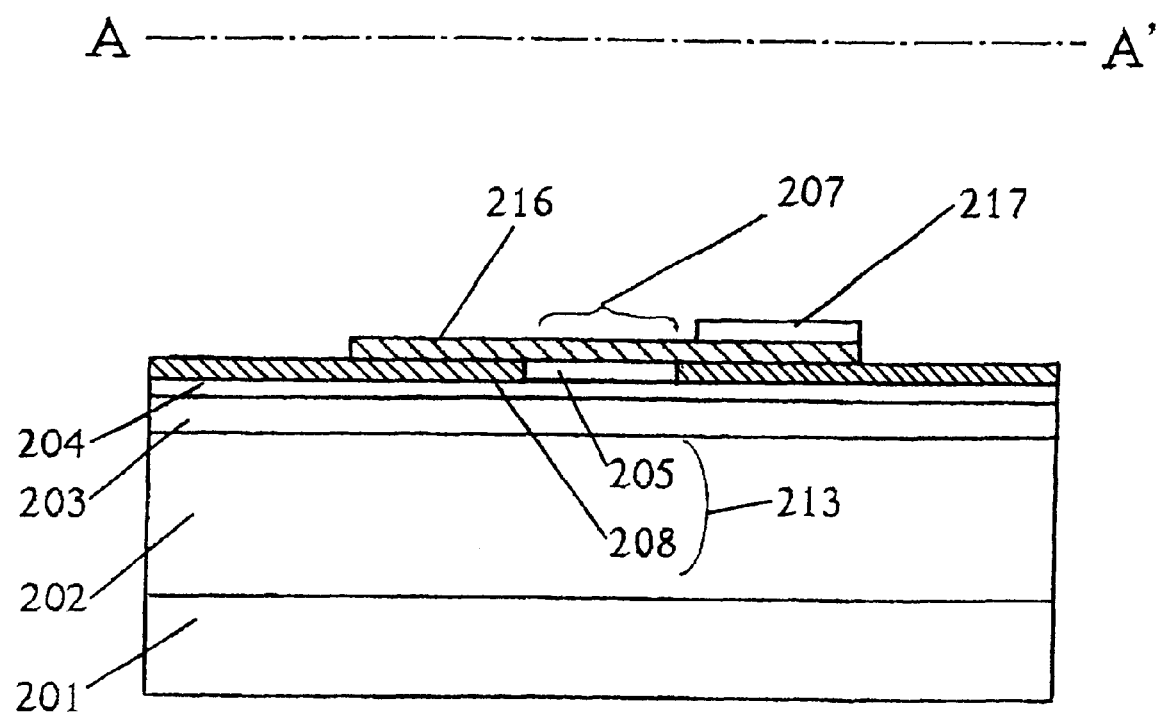
FIG. 32 is a sectional view showing the process for manufacturing the semiconductor laser in accordance with the third embodiment of the present invention.
Figure 33:
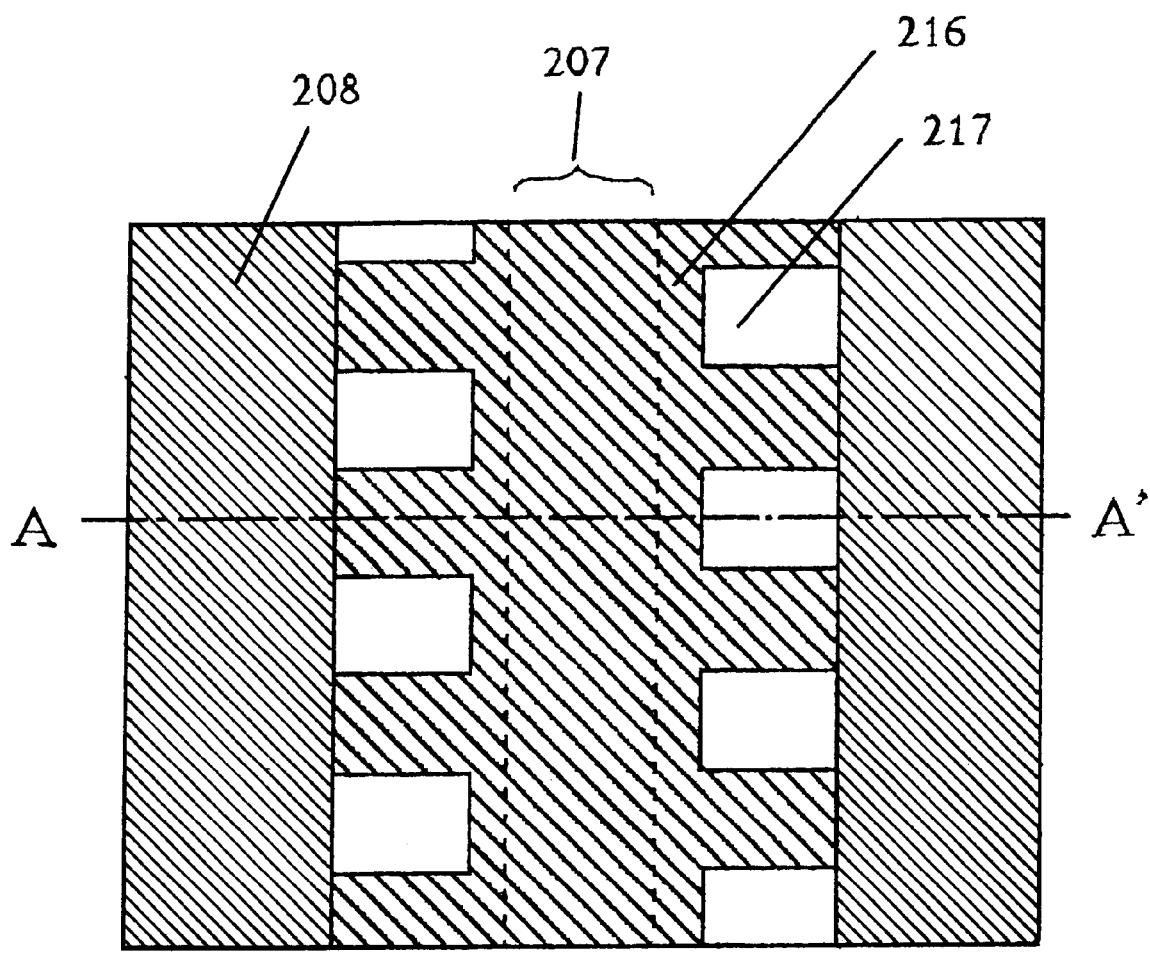
FIG. 33 is a top view showing the process for manufacturing the semiconductor laser in accordance with the third embodiment of the present invention.

Next, a $SiO_2$ film is formed to a thickness of 0.1 μ over the entire surface by an electron beam deposition method. Then a resist mask is formed by photolithography to partially expose the region of the n-type semiconductor layer 216 on the Al oxide layer 208, and the exposed $SiO_2$ is etched by wet etching using buffer hydrofluoric acid. The resist mask is removed to form a $SiO_2$ mask 217. FIG. 32 is a sectional view, and FIG. 33 is a top view.

Figure 34:
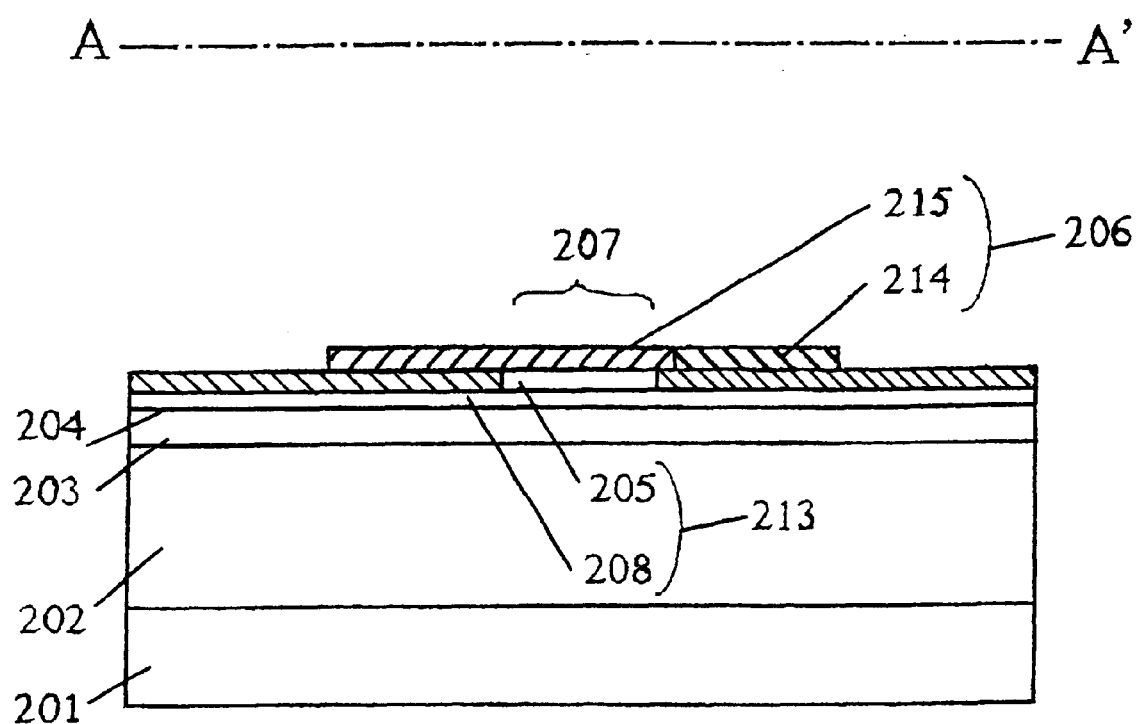
FIG. 34 is a sectional view showing the process for manufacturing the semiconductor laser in accordance with the third embodiment of the present invention.
Figure 35:
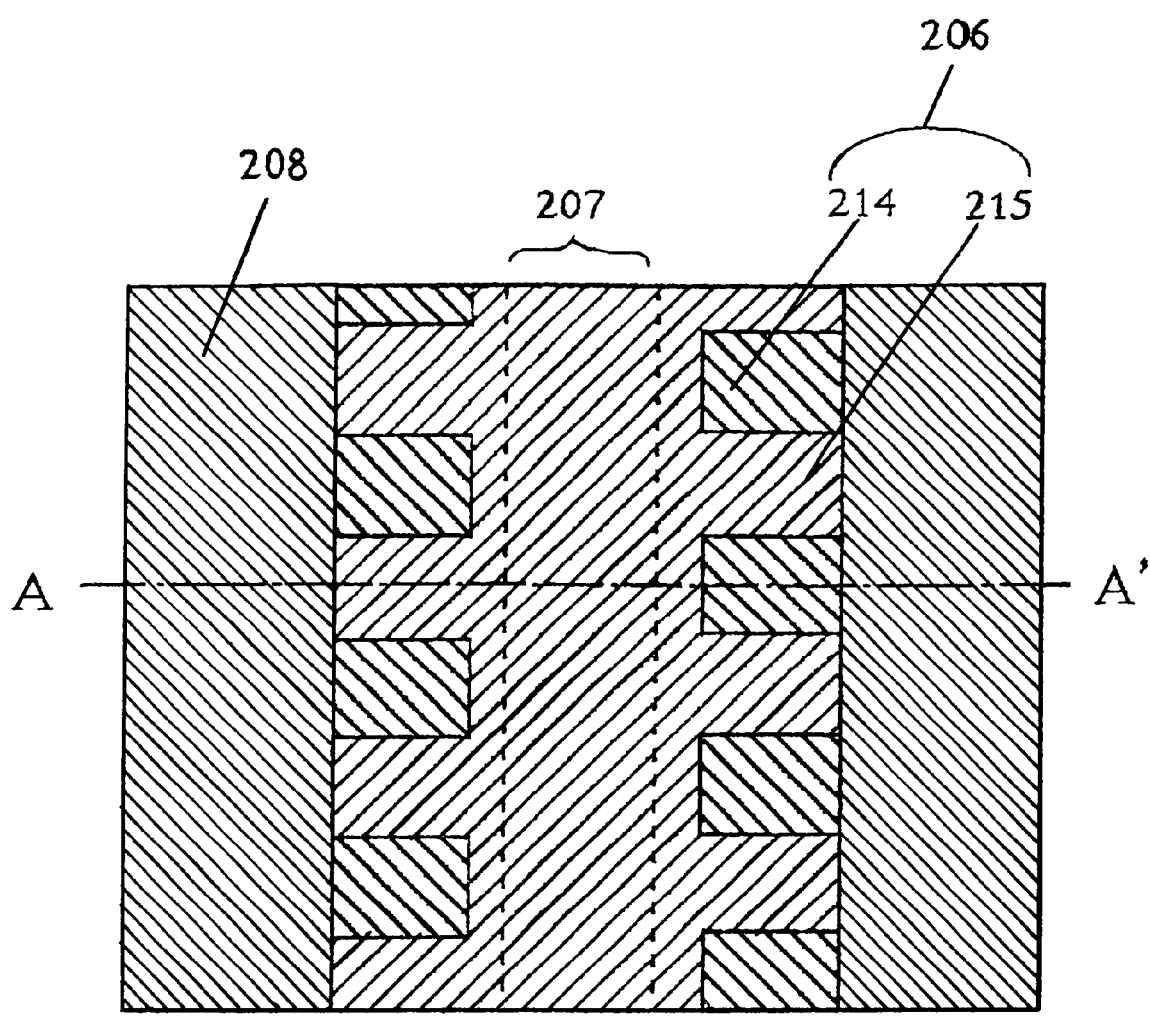
FIG. 35 is a top view showing the process for manufacturing the semiconductor laser in accordance with the third embodiment of the present invention.

Next, a high-concentration p-type impurity diffused region is formed in the n-type semiconductor layer 216 by vapor phase thermal diffusion of Zn using $ZnP_2$ and $ZnAs_2$ as diffusion sources. This thermal diffusion is carried out by heat treatment at 600° C. for 30 minutes. Then, the $SiO_2$ mask 217 is removed by etching with buffer hydrofluoric acid. In this way, the n-type region 214 which has previously been coated with the $SiO_2$ mask 217, and the high-concentration p-type region 215 doped with Zn by thermal diffusion are formed in the contact layer 206. The high-concentration p-type region 215 is formed in the stripe emission region 207, and the n-type region 214 and the high-concentration p-type region 215 are alternately formed in the region on the Al oxide layer 208 in the direction of the stripe length. FIG. 34 is a sectional view, and FIG. 35 is a top view. Although, in this embodiment, the $SiO_2$ mask 217 is removed, the $SiO_2$ mask 217 may be left for the sake of simplicity.

Then, the contact electrodes 210 are formed by a known vapor deposition method and lift off method. A plurality of the contact electrodes 210 are formed independently to respectively contact the high-concentration p-type regions 215 of the contact layer 206 on the Al oxide layer 208. The contact electrodes 210 are also formed so as not to overlap the emission region 207.

As the material for the contact electrodes 210, Cr, AuZn and Au are used in thicknesses of 10 nm, 100 nm, and 100 nm, respectively. Other materials such as Ti and the like may be used.

Figure 36:
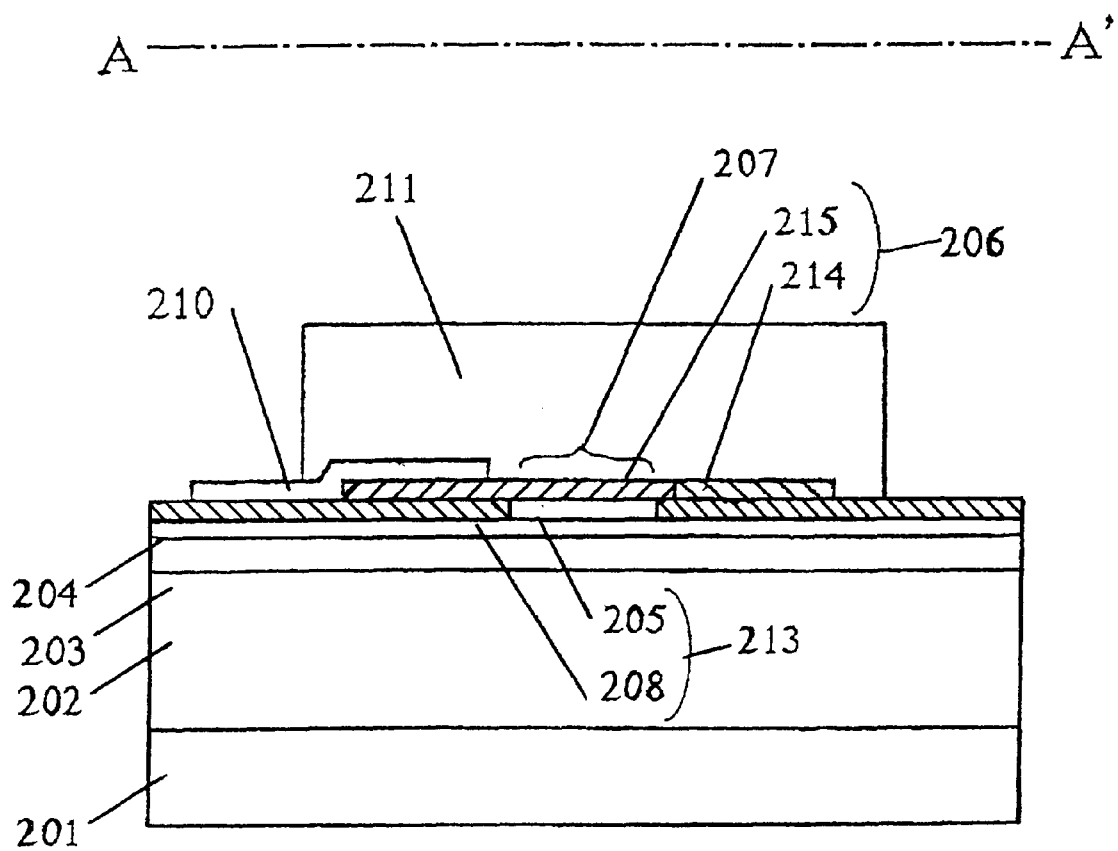
FIG. 36 is a sectional view showing the process for manufacturing the semiconductor laser in accordance with the third embodiment of the present invention.
Figure 37:
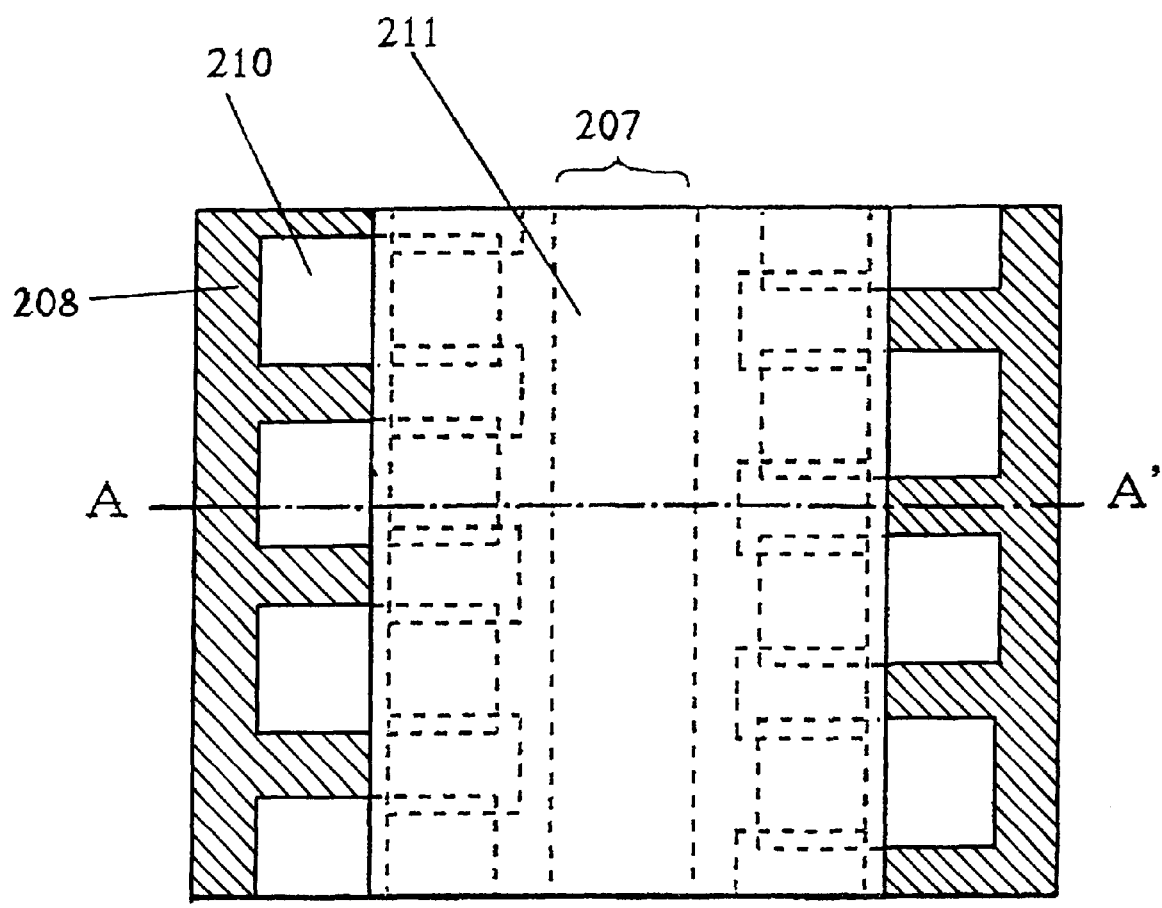
FIG. 37 is a top view showing the process for manufacturing the semiconductor laser in accordance with the third embodiment of the present invention.

Then, a dielectric multilayered reflecting film is formed to completely cover at least the stripe emission region 207, to form the second mirror 211. The dielectric multilayered reflecting film is formed by laminating 7 pairs of $SiO_2$ and $Ta_2O_5$. Other dielectric materials such as $TiO_2$, ZnSe, MgF, $Al_2O_3$, and the like may be used. Then, the lower electrode 212 made of Au-GeNiAu is formed below the n-type GaAs substrate 201. FIG. 36 is a sectional view, and FIG. 37 is a top view.

Although, in this embodiment, the electrodes are arranged in a staggered form, the electrodes may be arranged opposite to each other. Although the divided electrodes are formed on both sides of the stripe laser emission region, the electrodes may be formed on one of the sides.

Although the AlGaAs system semiconductor laser has been described above, of course, other materials such as AlGaInP system, InGaAs system, ZnMgSSe system, ZnSSe system, GaN system materials, and the like may be used.

In the surface emission type semiconductor laser of the present invention, the current narrowing layer is provided so that an insulation layer is formed directly below contact electrodes, thereby removing reactive currents directly below the contact electrodes. Therefore, it is possible to provide a light source having a low threshold value and high efficiency, and capable of scanning a laser emission point.

In addition, the contact electrodes do not overlap the emission region so as not to intercept a laser beam, thereby providing a structure suitable for emitting a laser beam from the surface side. Further, the area of contact between the contact layer and the contact electrodes can easily be increased, thereby decreasing contact resistance and heat generation.

Since the laser emission surface and the divided contact electrodes are in the same surface, material for the pedestal is not limited, thereby providing a light source having a high degree of mounting freedom and capable of scanning the laser emission point.

Further, in the surface emission type semiconductor laser of the present invention, current spreading in the stripe emission region in the direction of the stripe length can be suppressed to increase the current density, thereby further decreasing the threshold value and improving efficiency.

Industrial Applicability

The surface emission type semiconductor laser and the manufacturing method therefor of the present invention are suitably used for a light source of a semiconductor laser beam scanner for scanning a laser beam. The surface emission type semiconductor laser can also be used as a light source used in the fields of a laser beam printer, optical communication, etc.

What is claimed is:

1. A surface emission type semiconductor laser comprising a first reflecting mirror, an active layer, a current narrowing layer, a contact layer, a second reflecting mirror, and a contact electrode, which are formed on a semiconductor substrate, so that a laser beam is emitted perpendicularly to the semiconductor substrate;

wherein the current narrowing layer comprises an AlAs layer and an Al oxide layer formed to surround the AlAs layer;

the AlAs layer is formed in a stripe to form a stripe emission region;

the contact layer is formed in a stripe wider than the stripe emission region to completely cover the stripe emission region; and a plurality of contact electrodes are independently formed so as not to overlap the stripe emission region.

2. A surface emission type semiconductor laser according to claim 1;

wherein a region of the contact layer, which is formed on the Al oxide layer, is formed in a comb shape, and the plurality of the independent contact electrodes are formed to respectively contact the comb teeth of the contact layer.

3. A surface emission type semiconductor layer according to claim 1;

wherein the contact layer is a second conduction type in the stripe emission region, and a first conduction type region and a second conduction type region are alternately formed in the region of the contact layer on the Al oxide layer in the direction of the stripe length; and the plurality of the independent contact electrodes are formed to respectively contact the second conduction type regions of the contact layer on the Al oxide layer.

4. A surface emission type semiconductor laser for emitting a laser beam perpendicularly to a semiconductor substrate comprising:

a first reflecting mirror on said semiconductor substrate;

an active layer on said first reflecting mirror;

a current narrowing layer on said active layer, said current narrowing layer including a stripe of AlAs forming a stripe emission region, and a border of Al oxide outboard of said stripe of AlAs;

a contact layer on said current narrowing layer, said contact layer completely covering said stripe emission region;

a second reflecting mirror on said contact layer; and a plurality of contact electrodes coupled to said contact layer, said plurality of contact electrodes being independently formed so as to not overlap said stripe emission region.

5. The laser of claim 4 wherein a region of said contact layer on said border of Al oxide is formed in a comb shape and said plurality of contact electrodes independently contact comb teeth of said comb shape contact layer.

6. The laser of claim 4 wherein said border of Al oxide includes first conduction type regions and second conduction type regions alternately formed along a length of said stripe emission region and said plurality of contact electrodes independently contact said second conduction type regions.

* * * * *

UNITED STATES PATENT AND TRADEMARK OFFICE
CERTIFICATE OF CORRECTION

PATENT NO. : 6,501,778 B1
DATED : December 31, 2002
INVENTOR(S) : Kondo et al.

It is certified that error appears in the above-identified patent and that said Letters Patent is hereby corrected as shown below:

<u>Title page,</u>
Item [56] References Cited, OTHER PUBLICATIONS, Huffaker reference: "2=2" should be -- 2 x 2 --;

<u>Column 7,</u>
Line 59, delete "plane" and substitute -- surface -- therefor;

<u>Column 8,</u>
Line 1, delete "plane" and substitute -- surface -- therefor;
Lines 55 and 58, "layer 108" should be -- layer 105 --;

<u>Column 11,</u>
Line 5, "AlAS" should be -- AlAs --;
Line 47, "$A_2O_3$" should be -- $Al_2O_3$ --;

<u>Column 12,</u>
Line 54, "AlAS" should be -- AlAs --;

<u>Column 14,</u>
Lines 53 and 56, "layer 208" should be -- layer 205 --;

<u>Column 15,</u>
Lines 57 and 58, "later" should be -- layer --;
Line 64, "$ASH_3$" should be -- $AsH_3$ --;

UNITED STATES PATENT AND TRADEMARK OFFICE
CERTIFICATE OF CORRECTION

PATENT NO.     : 6,501,778 B1
DATED          : December 31, 2002
INVENTOR(S)    : Kondo et al.

It is certified that error appears in the above-identified patent and that said Letters Patent is hereby corrected as shown below:

<u>Column 18,</u>
Lines 32 and 39, "claim 1;" should be -- claim 1, --.

Signed and Sealed this

Thirtieth Day of September, 2003

JAMES E. ROGAN
*Director of the United States Patent and Trademark Office*